US010381273B1

(12) United States Patent
Cheng et al.

(10) Patent No.: US 10,381,273 B1
(45) Date of Patent: Aug. 13, 2019

(54) VERTICALLY STACKED MULTI-CHANNEL TRANSISTOR STRUCTURE

(71) Applicant: International Business Machines Corporation, Armonk, NY (US)

(72) Inventors: Kangguo Cheng, Schenectady, NY (US); Tenko Yamashita, Schenectady, NY (US); Chun-Chen Yeh, Danbury, CT (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/950,372

(22) Filed: Apr. 11, 2018

(51) Int. Cl.
*H01L 21/8238* (2006.01)
*H01L 27/092* (2006.01)
*H01L 29/66* (2006.01)
*H01L 29/78* (2006.01)
*H01L 27/11* (2006.01)
*H01L 29/08* (2006.01)
*H01L 23/535* (2006.01)

(52) U.S. Cl.
CPC ........... *H01L 21/823885* (2013.01); *H01L 21/823814* (2013.01); *H01L 21/823821* (2013.01); *H01L 21/823871* (2013.01); *H01L 23/535* (2013.01); *H01L 27/092* (2013.01); *H01L 27/0922* (2013.01); *H01L 27/0924* (2013.01); *H01L 27/1104* (2013.01); *H01L 29/0847* (2013.01); *H01L 29/66545* (2013.01); *H01L 29/66553* (2013.01); *H01L 29/66666* (2013.01); *H01L 29/7827* (2013.01)

(58) Field of Classification Search
CPC ..... H01L 21/823821; H01L 21/823431; H01L 21/845; H01L 27/0886; H01L 27/0922; H01L 27/0924; H01L 27/10826; H01L 27/10879; H01L 27/1207; H01L 27/1211; H01L 29/66795–29/66818; H01L 29/785–7856
See application file for complete search history.

(56) References Cited

U.S. PATENT DOCUMENTS

| 9,356,027 B1* | 5/2016 | Cheng ................. H01L 27/0924 |
| 2006/0220134 A1* | 10/2006 | Huo ........................ H01L 21/84 257/351 |
| 2006/0289940 A1* | 12/2006 | Hyun .................. H01L 27/1211 257/369 |
| 2007/0218659 A1* | 9/2007 | Spencer .......... H01L 21/823807 438/497 |

(Continued)

FOREIGN PATENT DOCUMENTS

WO 2018017677 A1 1/2018

*Primary Examiner* — Bryan R Junge
(74) *Attorney, Agent, or Firm* — Garg Law Firm, PLLC; Rakesh Garg; Grant Johnson

(57) ABSTRACT

A substrate structure for a vertically stacked transistor includes a substrate having at least one fin and a cavity formed through a portion of the substrate. An inner spacer disposed in the cavity. A first epitaxy layer disposed upon the substrate, and a liner is disposed on portions of the first epitaxy layer and the inner spacer. A second epitaxy layer is disposed upon a top portion of the liner. The first epitaxy layer and the second epitaxy layer share a common U-shaped fin body formed by the inner spacer and the at least one fin.

14 Claims, 21 Drawing Sheets

(56) References Cited

U.S. PATENT DOCUMENTS

| | | | |
|---|---|---|---|
| 2008/0135935 A1* | 6/2008 | Cho | H01L 21/845 |
| | | | 257/347 |
| 2016/0380002 A1* | 12/2016 | Cheng | H01L 27/1211 |
| | | | 257/347 |
| 2018/0005904 A1 | 1/2018 | Lee et al. | |
| 2018/0026043 A1 | 1/2018 | Adusumilli et al. | |

* cited by examiner

VERTICALLY STACKED MULTI-CHANNEL TRANSISTOR STRUCTURE

TECHNICAL FIELD

The present invention relates generally to a method, system, and computer program product for fabricating vertically stacked transistor structures. More particularly, the present invention relates to a method, system, and computer program product for fabricating vertically stacked multi-channel transistor structures.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

A fin-Field Effect Transistor (finFET) is a non-planar device in which a source and a drain are connected using a fin-shaped conducting channel (fin) above the insulator layer. In an FET, a gate has a source-side and a drain-side. Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one side of the fin and the drain of the other gate is on an opposite side of the fin. The direction along the lateral length of the fin running from one gate to the other gate is referred to herein as a lateral running direction of the fin.

FinFET structures that are used in semiconductor devices include lateral transport finFET structures and vertical transport finFET structures. In a lateral transport finFET, the fin structure extends laterally along a surface of the semiconductor device when viewed from above. In a vertical transport finFET, the fin structure extends vertically from a surface of the semiconductor device when viewed from above.

SUMMARY

The illustrative embodiments provide a method and apparatus formed by the method. An embodiment of a method of fabricating a vertically stacked transistor includes receiving a substrate structure having a substrate and a hard mask formed on a top surface of the substrate. The embodiment further includes forming a first recess within a portion of the substrate and the hard mask, forming a sacrificial layer within the first recess, and forming a substrate layer upon a top surface of the sacrificial layer. The embodiment further includes forming at least one fin in the substrate, and forming at least one second recess extending through portions of the substrate layer, the sacrificial layer, and the substrate. The embodiment further includes removing at least a portion of the sacrificial layer within the at least one second recess to form a cavity, and forming an inner spacer in the cavity. The embodiment further includes forming a first epitaxy layer upon the substrate, and forming a liner on portions of the first epitaxy layer and the inner spacer. The embodiment further includes forming a second epitaxy layer upon a top portion of the liner, the first epitaxy layer and the second epitaxy layer sharing a common U-shaped fin body formed by the inner spacer and the at least one fin.

In an embodiment, the at least one second recess is formed within a source/drain (S/D) region of the substrate. An embodiment further includes recessing, prior to forming the liner, the first epitaxy layer to expose the inner spacer.

An embodiment further includes removing, prior to forming the second epitaxy layer, a top portion of the liner such that the liner remains upon the first epitaxy layer and the inner spacer. The embodiment further includes depositing an organic planarizing layer (OPL) upon portions of the liner. The embodiment still further includes removing, after forming of the second epitaxy layer, the OPL from the liner.

An embodiment further includes etching a portion of the liner from the first epitaxy layer such that the liner is aligned with the second epitaxy layer. An embodiment further includes forming, prior to forming the at least one second recess, a dummy gate on a portion of the substrate and substrate layer, and forming a spacer over portions of the dummy gate. In an embodiment, the at least one second recess is formed adjacent to the spacer.

An embodiment further includes removing the dummy gate, and forming a metal gate in a void caused by removal of the dummy gate.

An embodiment further includes forming a first contact to a source region of the first epitaxy layer, forming a second contact to a source region of the second epitaxy layer, and forming a third contact to a drain region shared by the first epitaxy layer and the second epitaxy layer.

An embodiment further includes forming a first junction between the first epitaxy layer and the at least one fin, and forming a second junction between the second epitaxy layer and the at least one fin.

In an embodiment, the first epitaxy layer includes an n-type epitaxy material, and the second epitaxy layer includes a p-type epitaxy material. In an embodiment, the first epitaxy layer includes a p-type epitaxy material, and the second epitaxy layer includes an n-type epitaxy material.

In an embodiment, the sacrificial layer is formed of a silicon-germanium (SiGe) material. In an embodiment, the inner spacer is formed of a silicon nitride (SiN) material.

An embodiment of an apparatus includes a substrate structure having a substrate. In the embodiment, the substrate has at least one fin and a cavity formed through a portion of the substrate. The embodiment further includes an inner spacer disposed in the cavity, a first epitaxy layer disposed upon the substrate, and a liner disposed on portions of the first epitaxy layer and the inner spacer. The embodiment further includes a second epitaxy layer disposed upon a top portion of the liner, the first epitaxy layer and the second epitaxy layer sharing a common U-shaped fin body formed by the inner spacer and the at least one fin.

An embodiment further includes a gate disposed on a portion of the substrate, and a metal gate material disposed within a portion of the gate.

An embodiment further includes a first contact connected to a source region of the first epitaxy layer, a second contact connected to a source region of the second epitaxy layer, and a third contact connected to a drain region shared by the first epitaxy layer and the second epitaxy layer.

An embodiment further includes a first junction formed between the first epitaxy layer and the at least one fin, and a second junction formed between the second epitaxy layer and the at least one fin.

In an embodiment the first epitaxy layer includes an n-type epitaxy material, and the second epitaxy layer includes a p-type epitaxy material. In an embodiment, the first epitaxy layer includes a p-type epitaxy material, and the second epitaxy layer includes an n-type epitaxy material.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
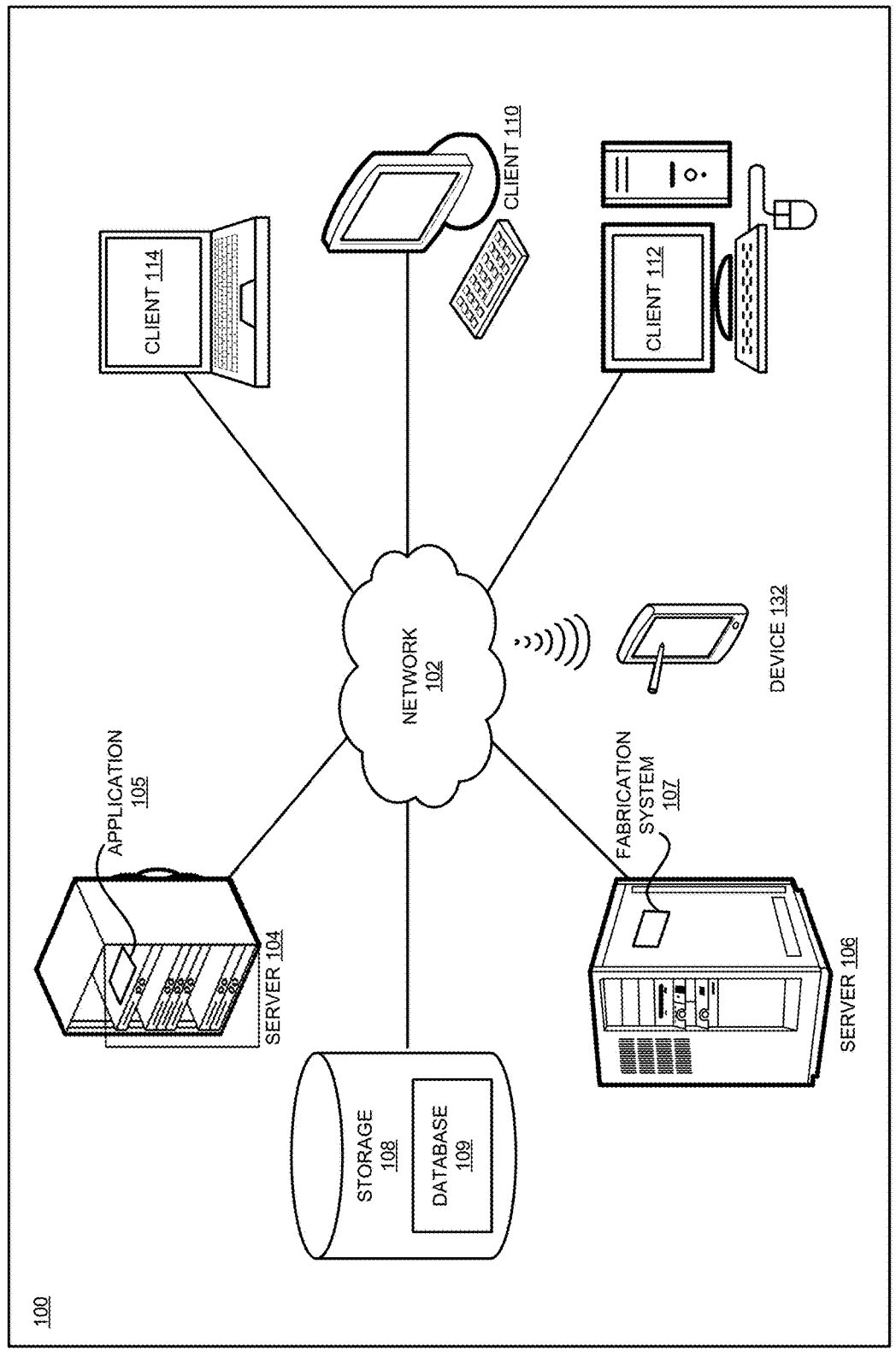
FIG. 1 depicts a block diagram of a network of data processing systems in which illustrative embodiments may be implemented.

The illustrative embodiments relate to a method, apparatus produced by the method, and computer program product for fabricating vertically stacked multi-channel transistor structures. The illustrative embodiments recognize that the present methods and techniques for fabricating vertically stacked multi-channel transistor structures for high-density applications suffer from several problems. Continuous transistor dimension scaling calls for transistor structures to realize not only enhanced power and/or performance, but also improvement in chip area density. For example, current VFET structures require multiple fins to achieve n-type and p-type logic on the same semiconductor structure leading to a large chip area being required during fabrication. Nanosheet transistor structures also suffer from a similar chip area penalty. Certain embodiments used to describe the invention generally address and solve one or more of the above-described problems and other problems related to fabricating vertically stacked multi-channel transistors for high-density applications.

Various embodiments provide for fabricating a vertically stacked multi-channel transistor structure that enables vertical stacking of an n-type FET (NFET) and a p-type FET (PFET) to realize a logic circuit such as an inverter while maximizing transistor pack density. In other embodiments, the principles described herein may be extended to transistor structures using hetero-integration of semiconductor materials such as III-V materials and silicon-germanium (SiGe) as well as graphene 2-D materials with multiple layers. One or more embodiments are directed to a method and structure for forming a FinFET (e.g., a complementary metal-oxide-semiconductor (CMOS)) device by vertically stacking a PFET on top of an NFET in which the PFET and NFET share a common 90-degree rotated U-shaped fin to increase device density while reducing manufacturing complexity (e.g., forming contacts). One or more embodiments are directed to a transistor device having a stacked FinFET CMOS device with a PFET and an NFET sharing a common 90-degree rotated U-shape fin so that the entire fin height can be used to conduct current. One or more particular embodiments, are directed to a static random access memory (SRAM) cell built using the inventive stacked FinFET CMOS device described herein.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate vertically stack transistor structures described herein.

For the clarity of the description, and without implying any limitation thereto, the illustrative embodiments are described using an n-type FET and a p-type FET (PFET) sharing a common 90-degree rotated U-shaped fin disposed on a substrate. An embodiment can be implemented with different types and/or numbers of transistors, a different number of gates, and/or a different number of substrates within the scope of the illustrative embodiments.

Furthermore, a simplified diagram of the example NFETs and PFETs are used in the figures and the illustrative embodiments. In an actual fabrication of a NFET and PFET, additional structures that are not shown or described herein may be present without departing the scope of the illustrative embodiments. Similarly, within the scope of the illustrative embodiments, a shown or described structure in the example NFETs and PFETs may be fabricated differently to yield a similar operation or result as described herein.

Differently shaded portions in the two-dimensional drawing of the example NFETs and PFETs are intended to represent different structures in the example NFETs and PFETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating NFETs and PFETs according to the illustrative embodiments.

Furthermore, the illustrative embodiments are described with respect to NFETs and PFETs only as an example. The steps described by the various illustrative embodiments can be adapted for fabricating other planar and non-planar devices employing vertically stacked transistor structures in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating vertically stacked transistor devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
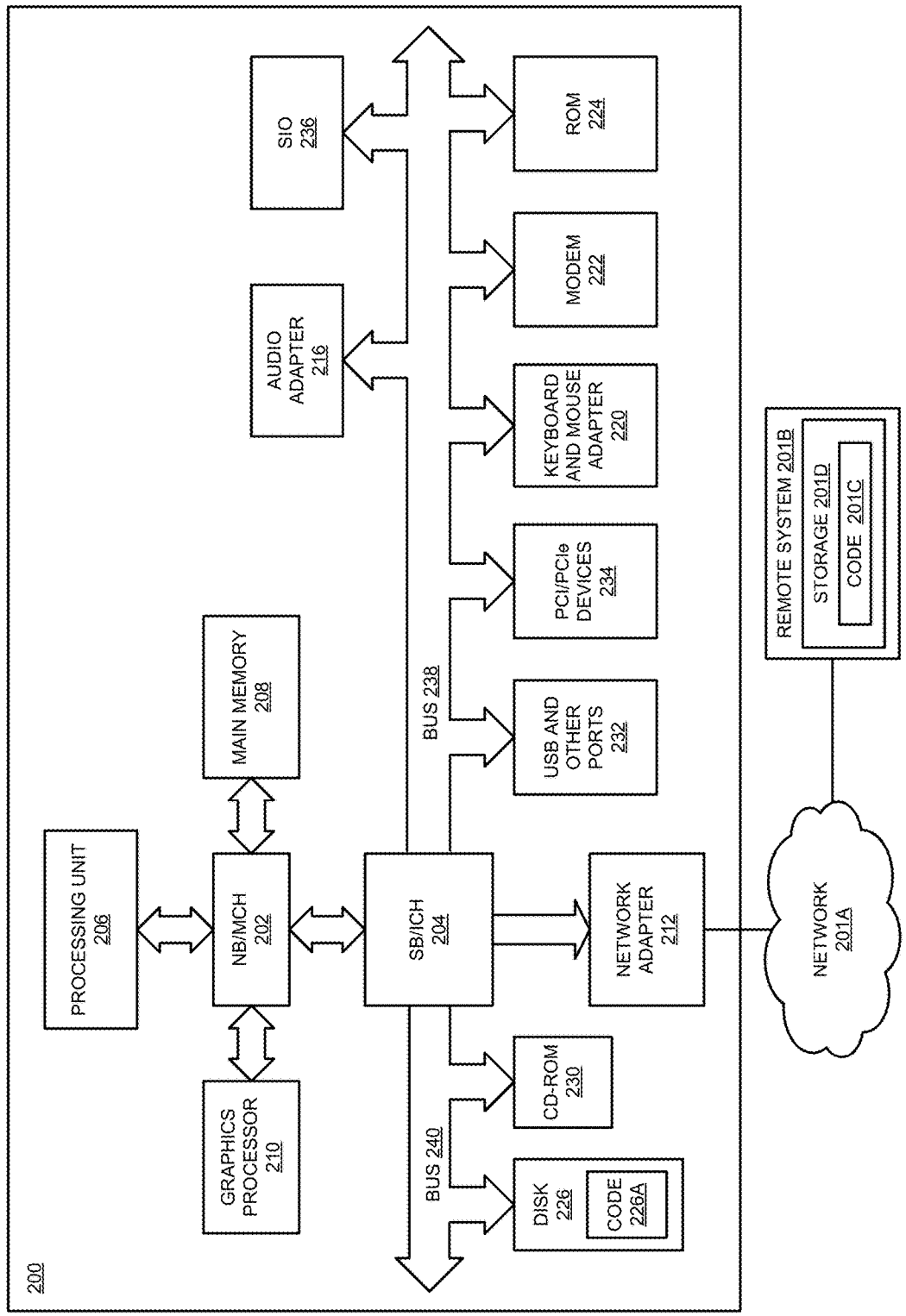
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be Implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more vertically stacked multi-channel transistor structures in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service-oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-18, these figures depict an example process for fabricating vertically stacked multi-channel transistor structures in accordance with one or more illustrative embodiments. FIGS. 3-18 depict two cross-sectional views of semiconductor structures produced by the process in which a first cross-sectional view (x) is depicted along a fin of the semiconductor structure, and a second cross-sectional view (y) is depicted along a gate of the semiconductor structure. In the particular embodiments illustrated in FIGS. 3-18, an NFET structure and a PFET structure are fabricated upon a substrate and/or wafer. It should be understood that in other embodiments, any combination of NFETs and PFETs or other combinations of any numbers of vertically stacked semiconductor devices, may be fabricated on a substrate in a similar manner.

Figure 3:
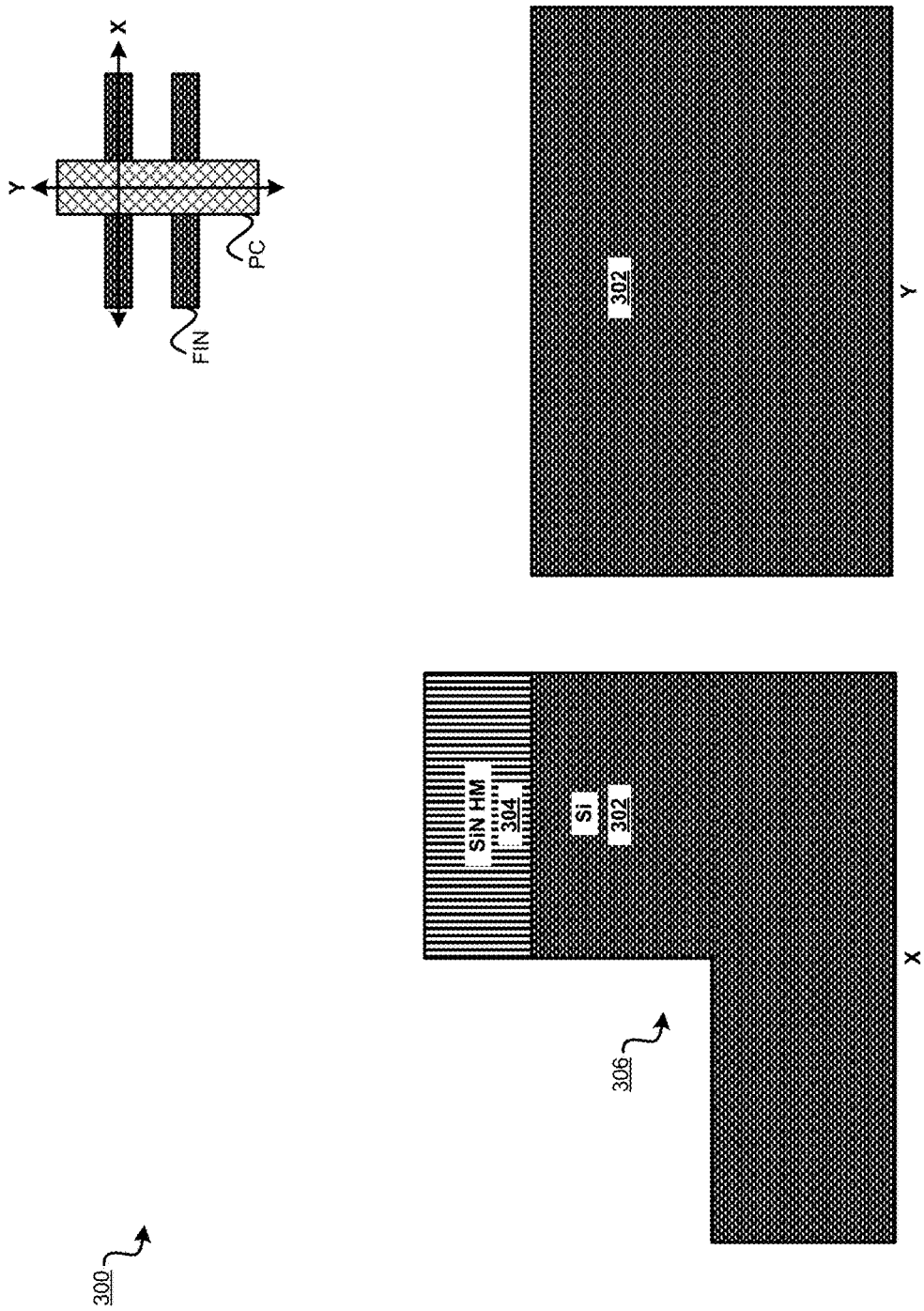
FIG. 3 depicts a portion of a process according to an illustrative embodiment.

With reference to FIG. 3, this figure depicts a portion of a process in which an example substrate structure 300 is received according to an illustrative embodiment. Substrate structure 300 includes a substrate 302 having a hard mask 304 deposited on a top surface of substrate 302. In particular embodiments, substrate 302 is formed of a silicon (Si) material and hard mask 304 is formed of a silicon nitride (SiN) material. Fabrication system 107 forms a recess 306 within a portion of substrate 302 and hard mask 304. In one or more embodiments, fabrication system 107 forms recess 306 within a portion of substrate 302 and hard mask 304 using an etching process.

Figure 4:
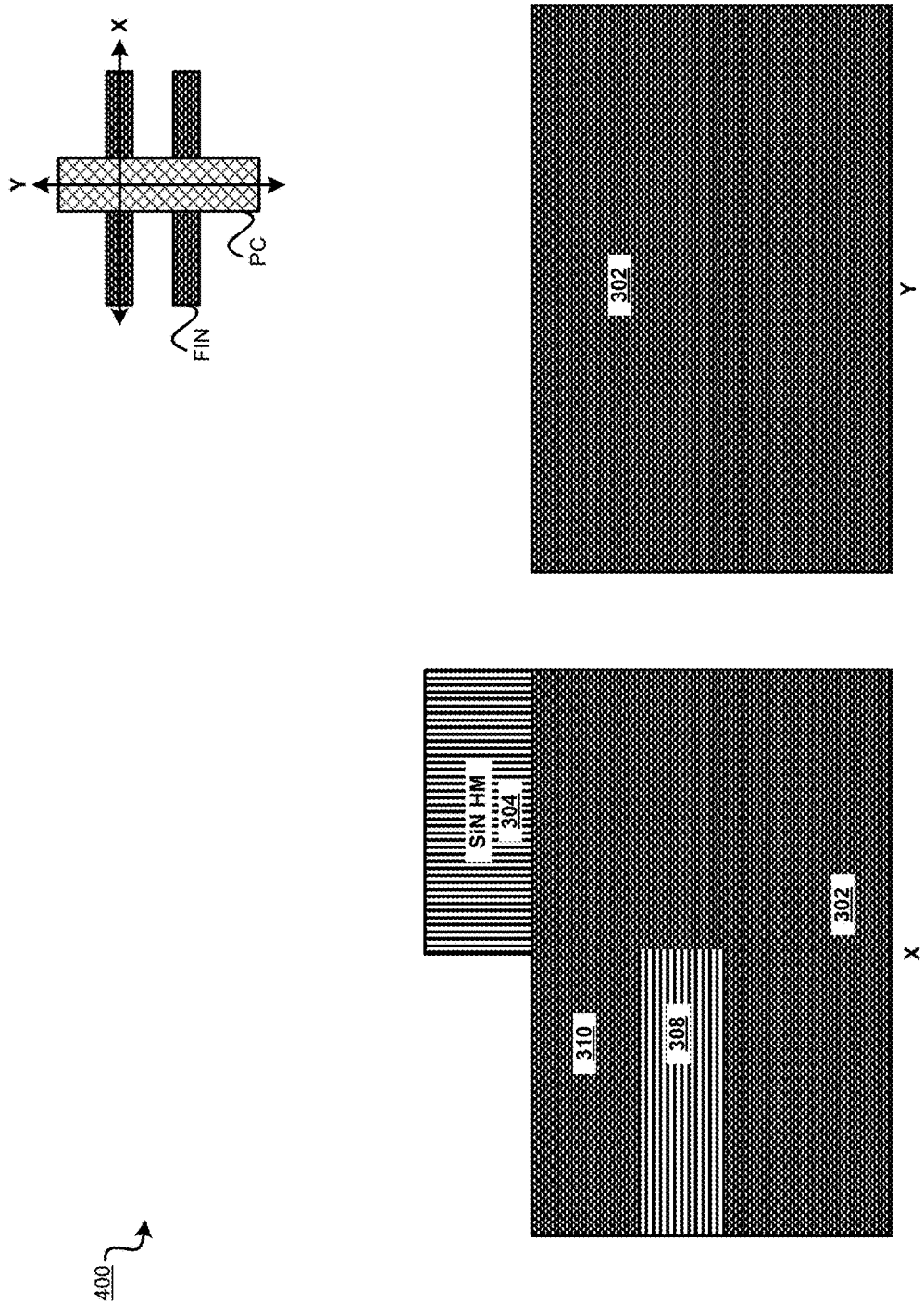
FIG. 4 depicts another portion of a process according to an illustrative embodiment.

With reference to FIG. 4, FIG. 4 depicts another portion of a process in which a structure 400 is formed according to an embodiment. In one or more embodiments, fabrication system 107 forms a sacrificial layer 308 in recess 306. In one or more embodiments, fabrication system 107 forms sacrificial layer 308 in recess 306 by growing sacrificial layer 308 upon an upper surface of recess 306 of substrate 302. In a particular embodiment, sacrificial layer 308 is formed of an SiGe material. In the embodiment, fabrication system 107 further forms an Si layer 310 or another substrate material layer upon sacrificial layer 308 to a top surface of the non-recessed portion of substrate 302. In one or more embodiments, fabrication system 107 forms Si layer 310 upon sacrificial layer 308 by growing Si layer 310 upon an upper surface of sacrificial layer 308.

Figure 5:
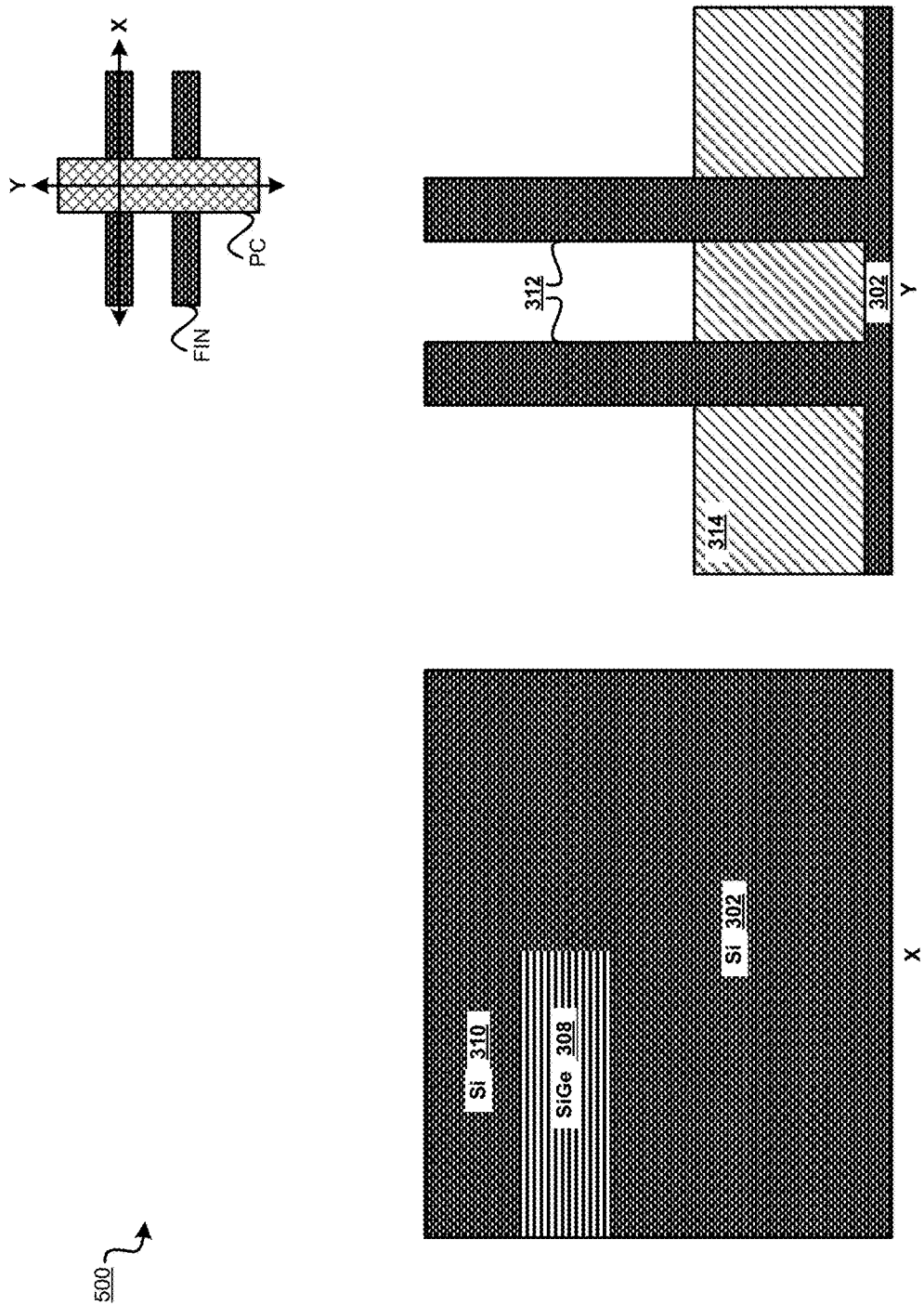
FIG. 5 depicts another portion of a process according to an illustrative embodiment.

With reference to FIG. 5, FIG. 5 depicts another portion of a process in which structure 500 is formed according to an embodiment. In one or more embodiments, fabrication system 107 removes hard mask 304 and patterns substrate 302 to form two vertical fins 312 of substrate 302. In a particular embodiment, fabrication system 107 forms fins 312 using a photolithography process. In the embodiment, fabrication system 107 further forms a shallow trench isolation (STI) material 314 on portions of substrate 302 adjacent to fins 312.

Figure 6:
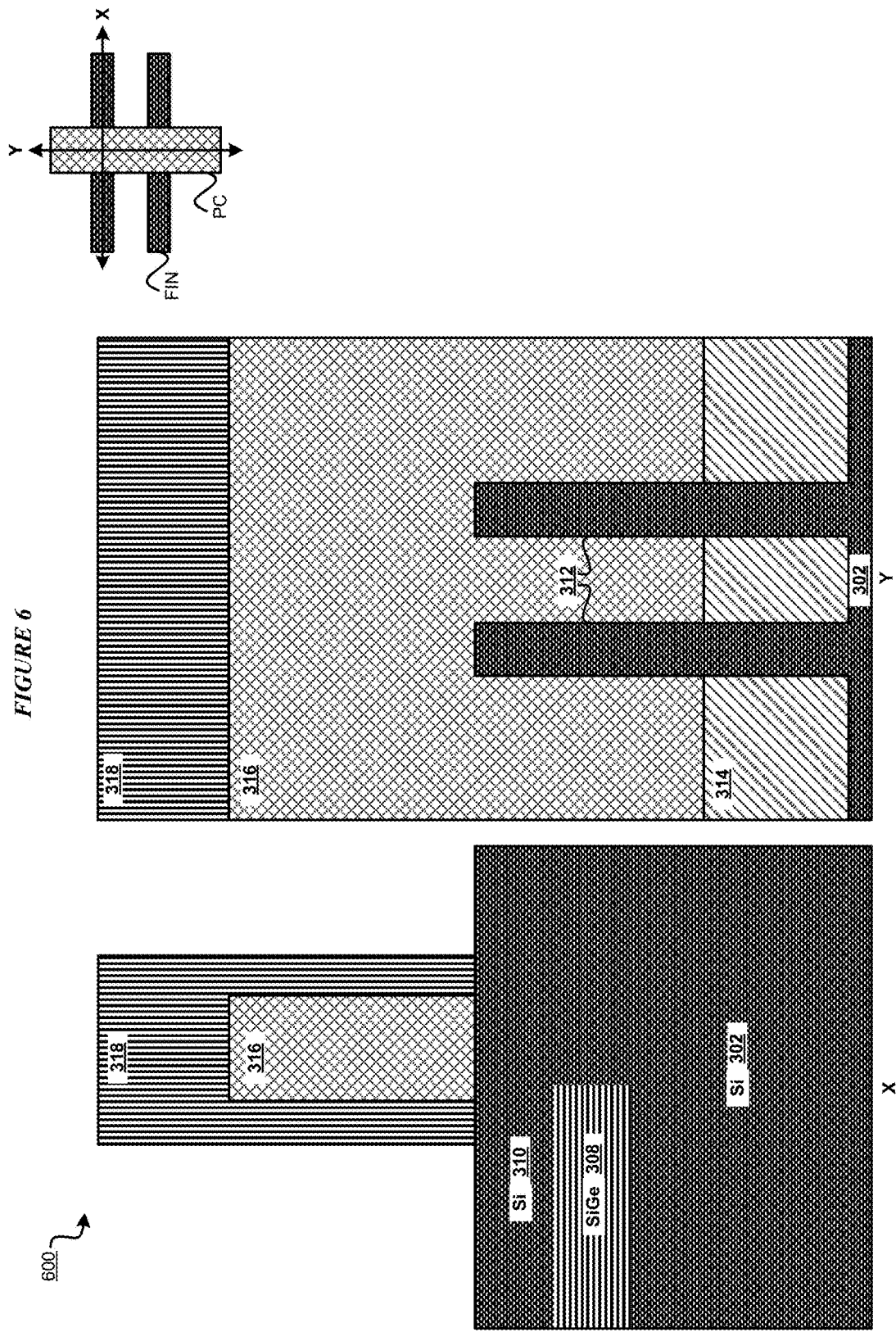
FIG. 6 depicts another portion of a process according to an illustrative embodiment.

With reference to FIG. 6, FIG. 6 depicts another portion of a process in which a structure 600 is formed according to an embodiment. In one or more embodiments, fabrication system 107 forms a vertical dummy gate 316 on portions of substrate 302 and Si layer 310. In a particular embodiment, dummy gate 316 is formed of a polysilicon material. In the embodiment, fabrication system 107 further forms a spacer 318 over portions of dummy gate 316. In a particular embodiment, spacer 318 is formed of an oxide material. In one or more embodiments, fabrication system forms dummy gate 316 and/or spacer 318 by a deposition process.

Figure 7:
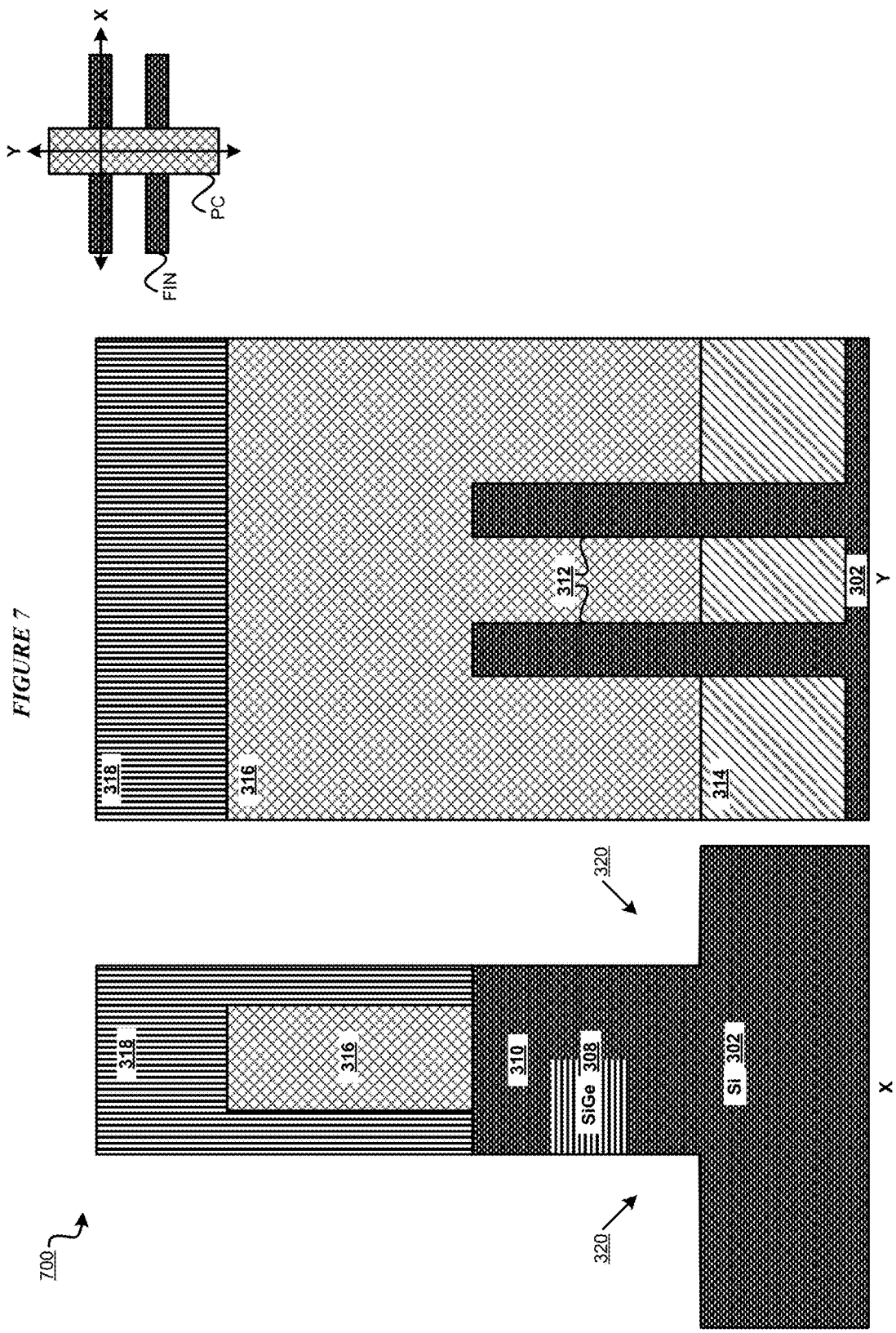
FIG. 7 depicts another portion of a process according to an illustrative embodiment.

With reference to FIG. 7, FIG. 7 depicts another portion of a process in which a structure 700 is formed according to an embodiment. In the embodiment, fabrications system 107 forms recesses 320 within source/drain (S/D) regions of substrate 302 adjacent to spacer 318 in which recesses 320 extend through portions of Si layer 310, sacrificial layer 308, and substrate 302.

Figure 8:
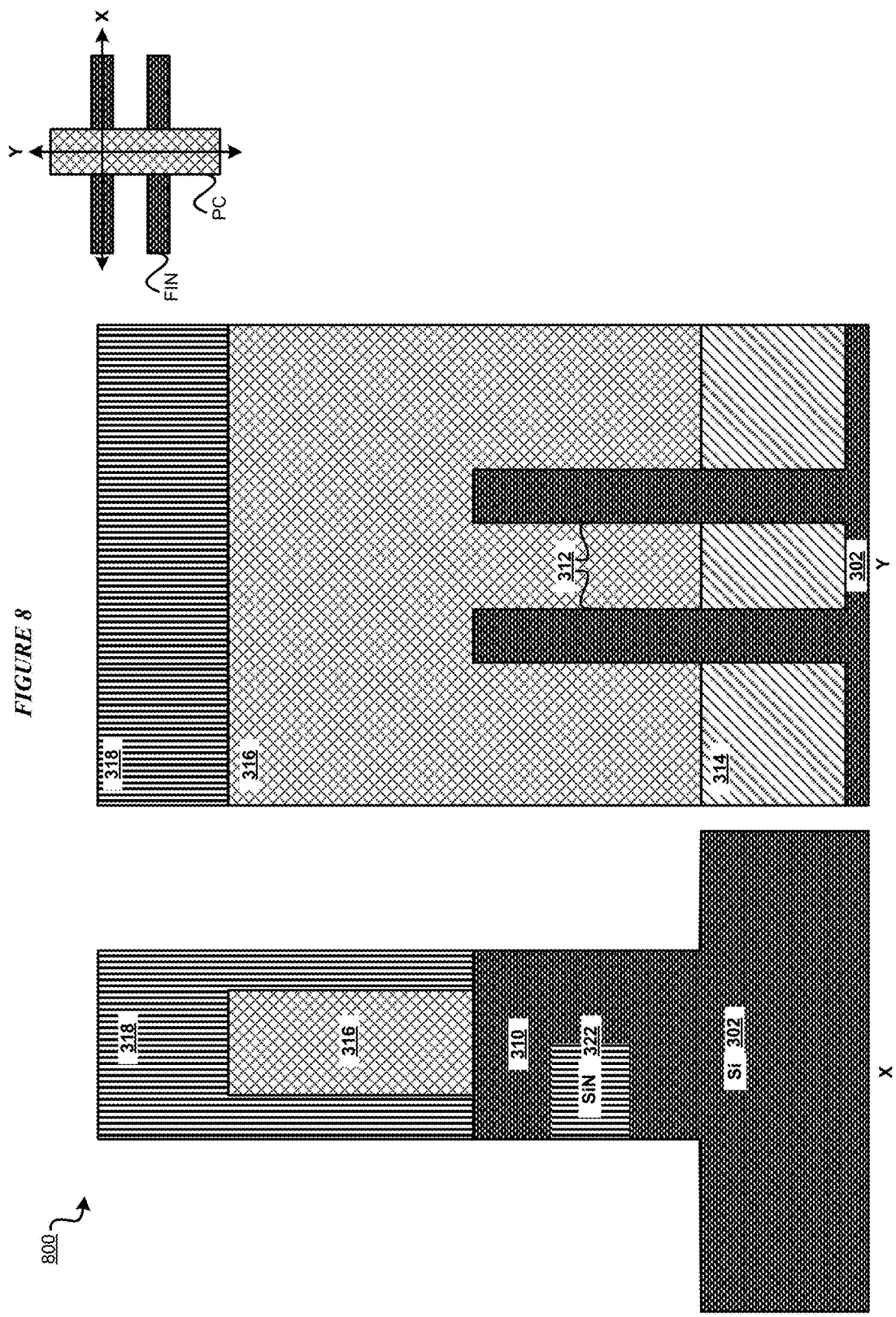
FIG. 8 depicts another portion of a process according to an illustrative embodiment.

With reference to FIG. 8, FIG. 8 depicts another portion of a process in which a structure 800 is formed according to an embodiment. In one or more embodiments, fabrication system 107 recesses sacrificial layer 308 to substantially remove sacrificial layer 308 to form a cavity. In a particular embodiment, fabrication system 107 recesses sacrificial layer 308 using an etching process. In the embodiment, fabrication system 107 further forms inner spacer 322 in the cavity caused by the removal of sacrificial layer 308 such that sacrificial layer 308 is substantially replaced with inner spacer 322 to form a rotated U-shaped fin disposed on substrate 302. In a particular embodiment, inner spacer 322 is formed of a SiN material.

Figure 9:
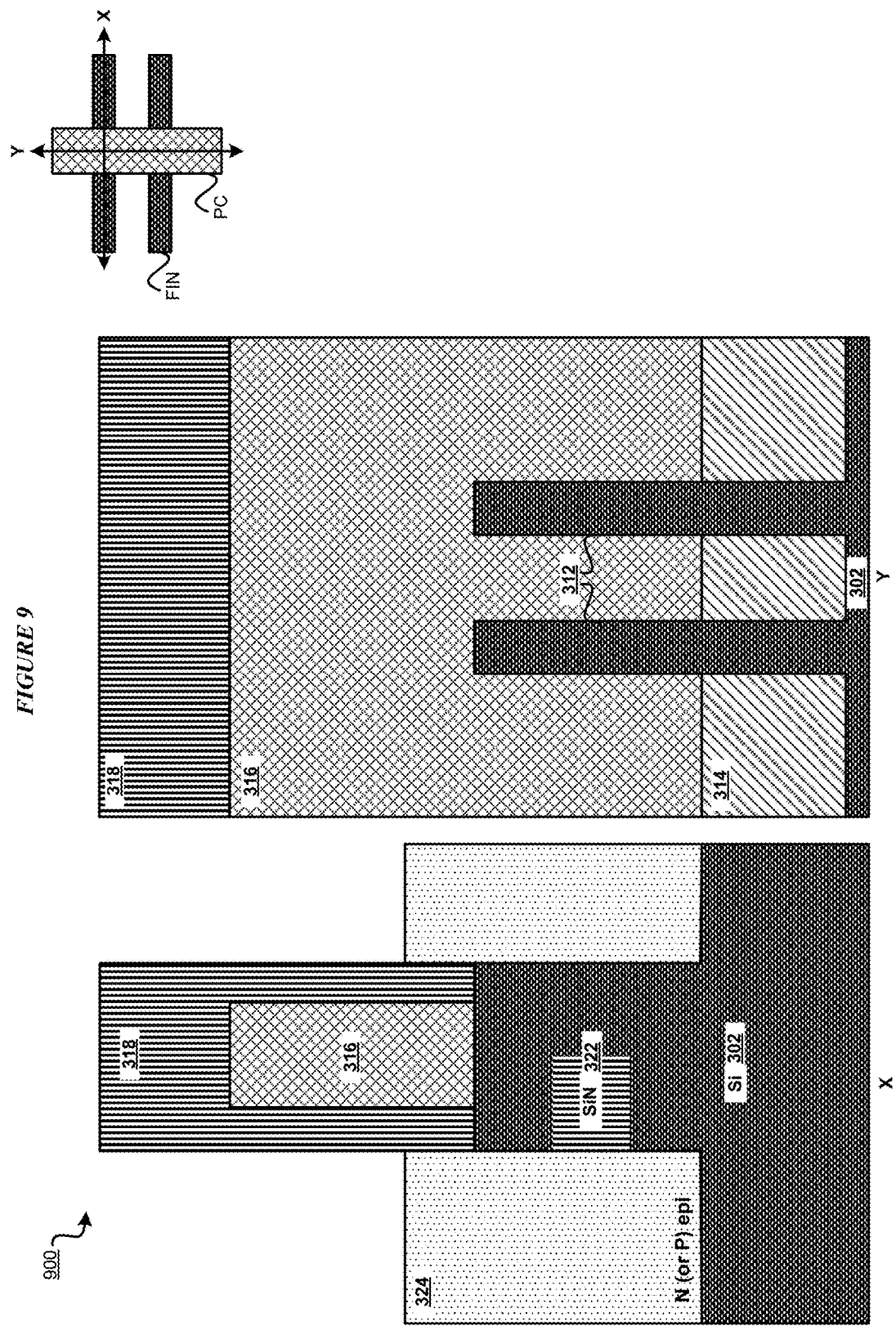
FIG. 9 depicts another portion of a process according to an illustrative embodiment.

With reference to FIG. 9, FIG. 9 depicts another portion of a process in which a structure 900 is formed according to an embodiment. In one or more embodiments, fabrication system 107 forms an n-type epitaxy layer 324 upon substrate 302. In a particular embodiment, fabrication system 107 forms n-type epitaxy layer 324 using an epitaxy growth process. In an alternative embodiment, fabrication system 107 forms a p-type epitaxy layer instead of n-type epitaxy layer 324.

Figure 10:
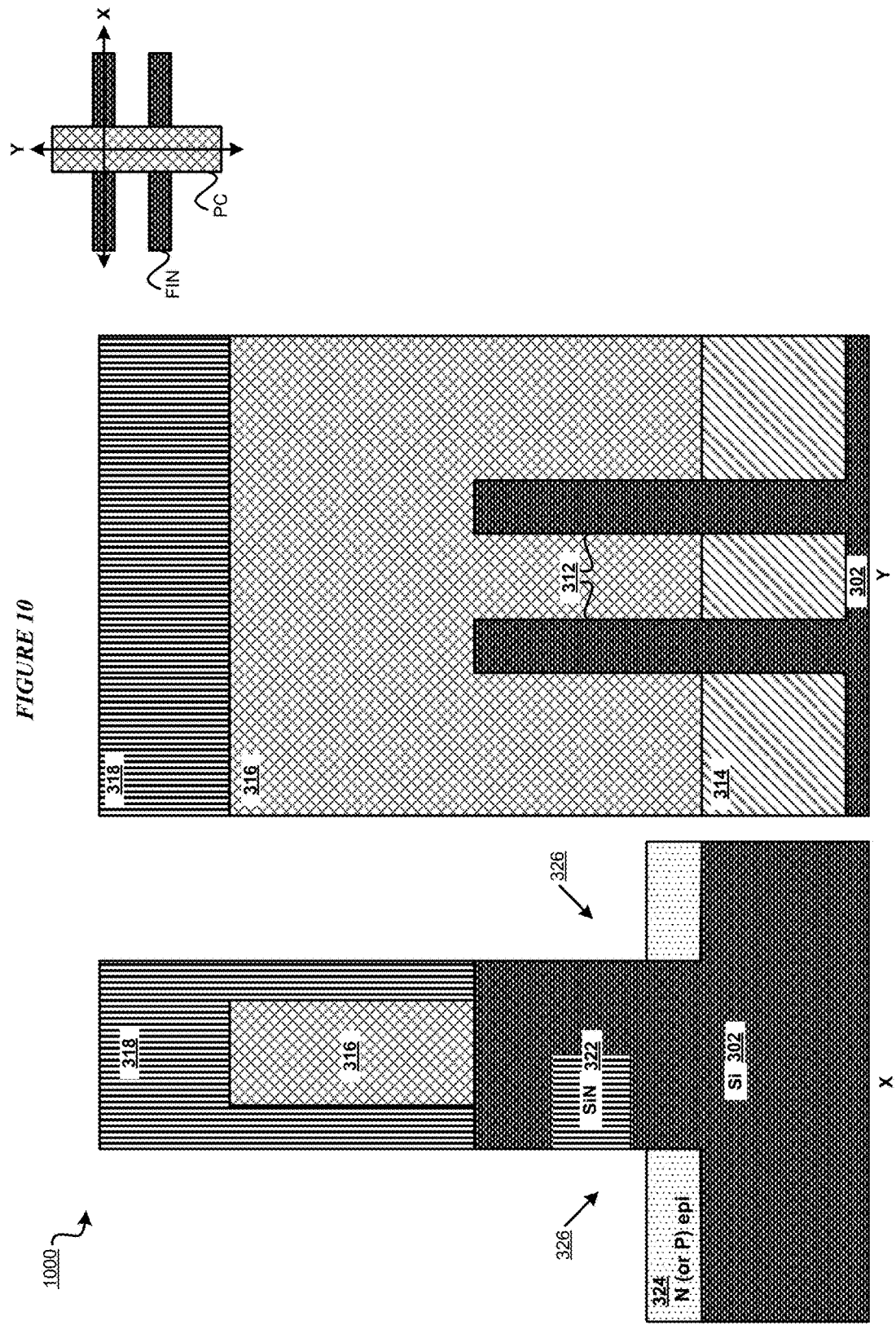
FIG. 10 depicts another portion of a process according to an illustrative embodiment.

With reference to FIG. 10, FIG. 10 depicts another portion of a process in which a structure 1000 is formed according to an embodiment. In one or more embodiments, fabrication system 107 recesses n-type epitaxy layer 324 to form recesses 326 to expose inner spacer 322.

Figure 11:
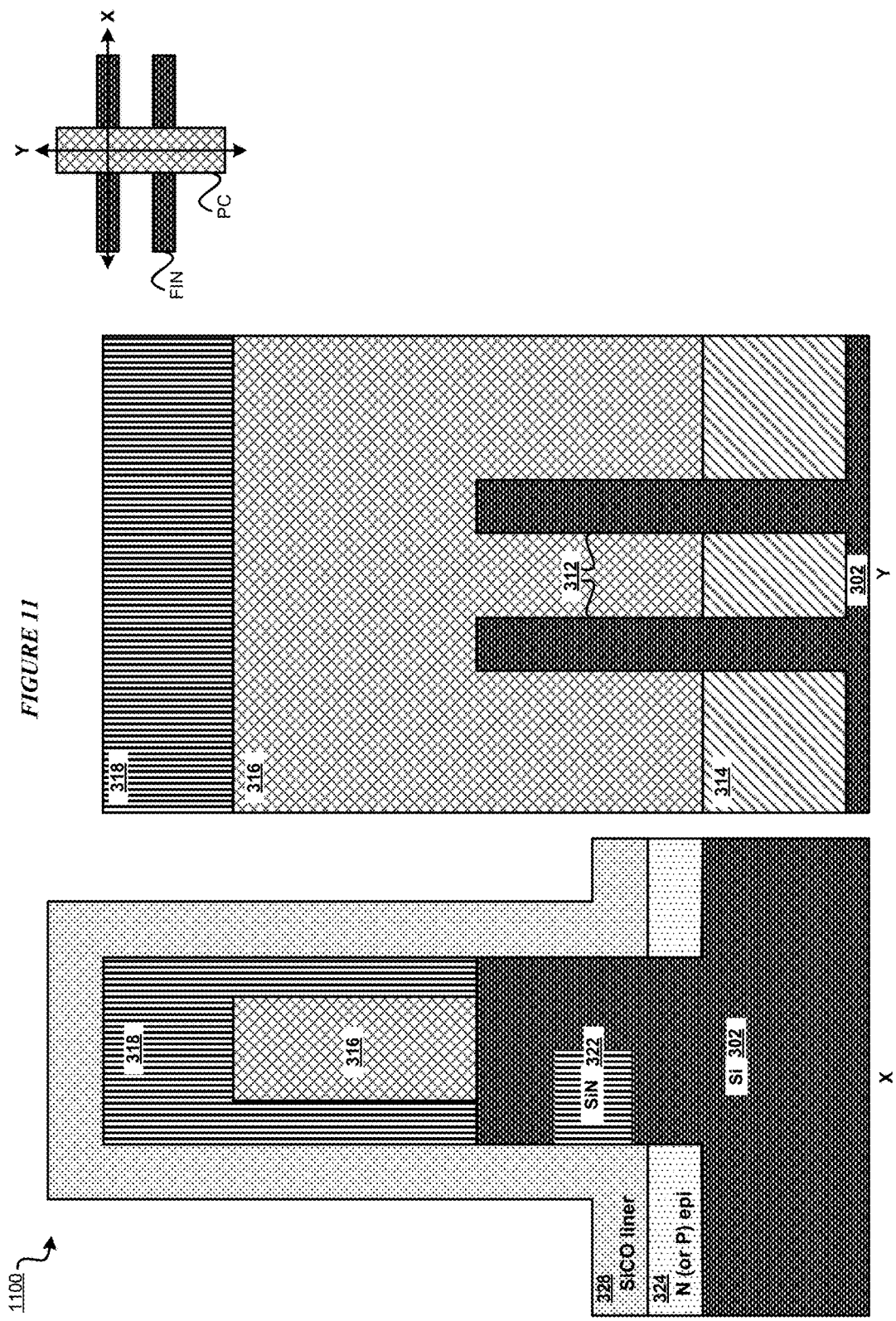
FIG. 11 depicts another portion of a process according to an illustrative embodiment.

With reference to FIG. 11, FIG. 11 depicts another portion of a process in which a structure 1100 is formed according to an embodiment. In one or more embodiments, fabrication system 107 deposits a liner 328 on portions of n-type epitaxy layer 324, inner spacer 322, and spacer 318. In a particular embodiment, liner 328 is formed of a silicon oxycarbide (SiCO) material.

Figure 12:
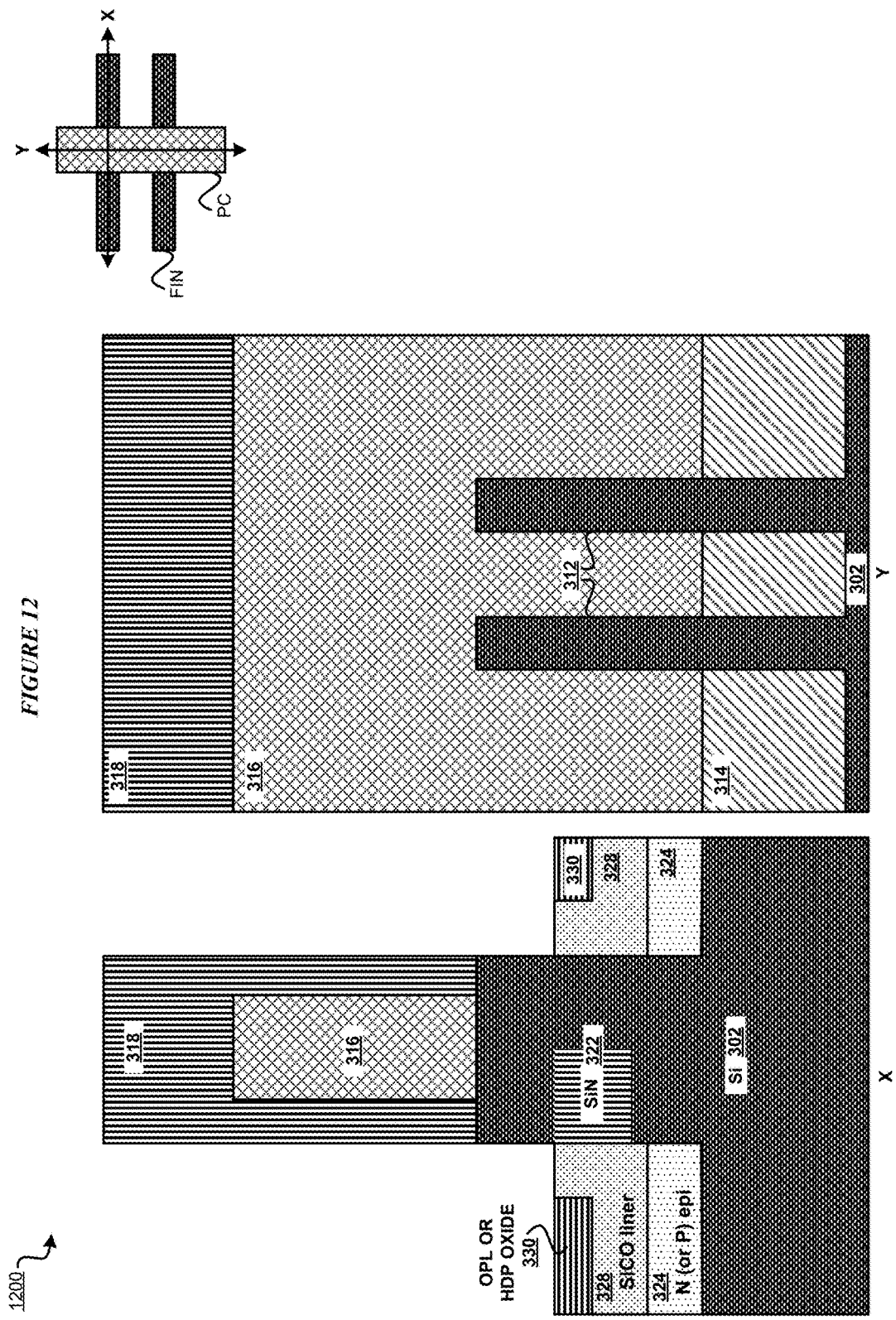
FIG. 12 depicts another portion of a process according to an illustrative embodiment.

With reference to FIG. 12, FIG. 12 depicts another portion of a process in which a structure 1200 is formed according to an embodiment. In the embodiment, fabrication system 107 removes a top portion of liner 328 from spacer 318 such that liner 328 remains upon n-type epitaxy layer 324 and inner spacer 322. In the embodiment, fabrication system 107 further deposits an organic planarizing layer (OPL) or oxide layer 330 upon portions of liner 328.

Figure 13:
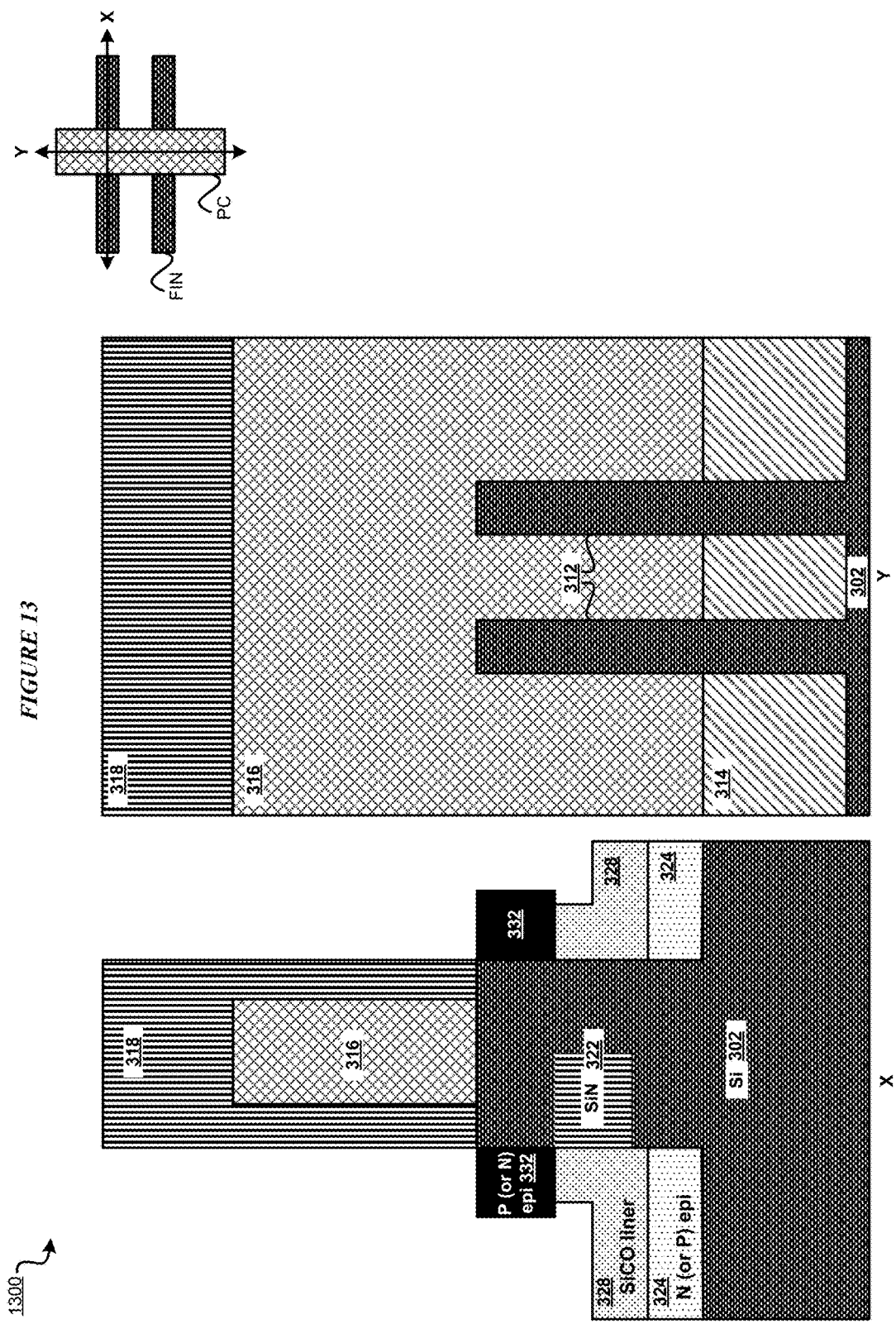
FIG. 13 depicts another portion of a process according to an illustrative embodiment.

With reference to FIG. 13, FIG. 13 depicts an optional portion of a process in which a structure 1300 is formed according to an embodiment. In one or more embodiments, fabrication system 107 forms a p-type epitaxy layer 332 upon a top portion of liner 328. As a result, n-type epitaxy layer 324 and a p-type epitaxy layer 332 share a common 90-degree rotated U-shaped fin body formed by inner spacer 322 and one more of fins 312. In a particular embodiment, fabrication system 107 forms p-type epitaxy layer 332 using an epitaxy growth process. In an alternative embodiment in which an n-type epitaxy layer is formed instead of a p-type epitaxy layer on substrate 302 as described in FIG. 9, fabrication system 107 forms a n-type epitaxy layer instead of p-type epitaxy layer 324 upon the top portion of liner 328. In one or more embodiments, fabrication system 107 further removes (OPL) or oxide layer 330.

Figure 14:
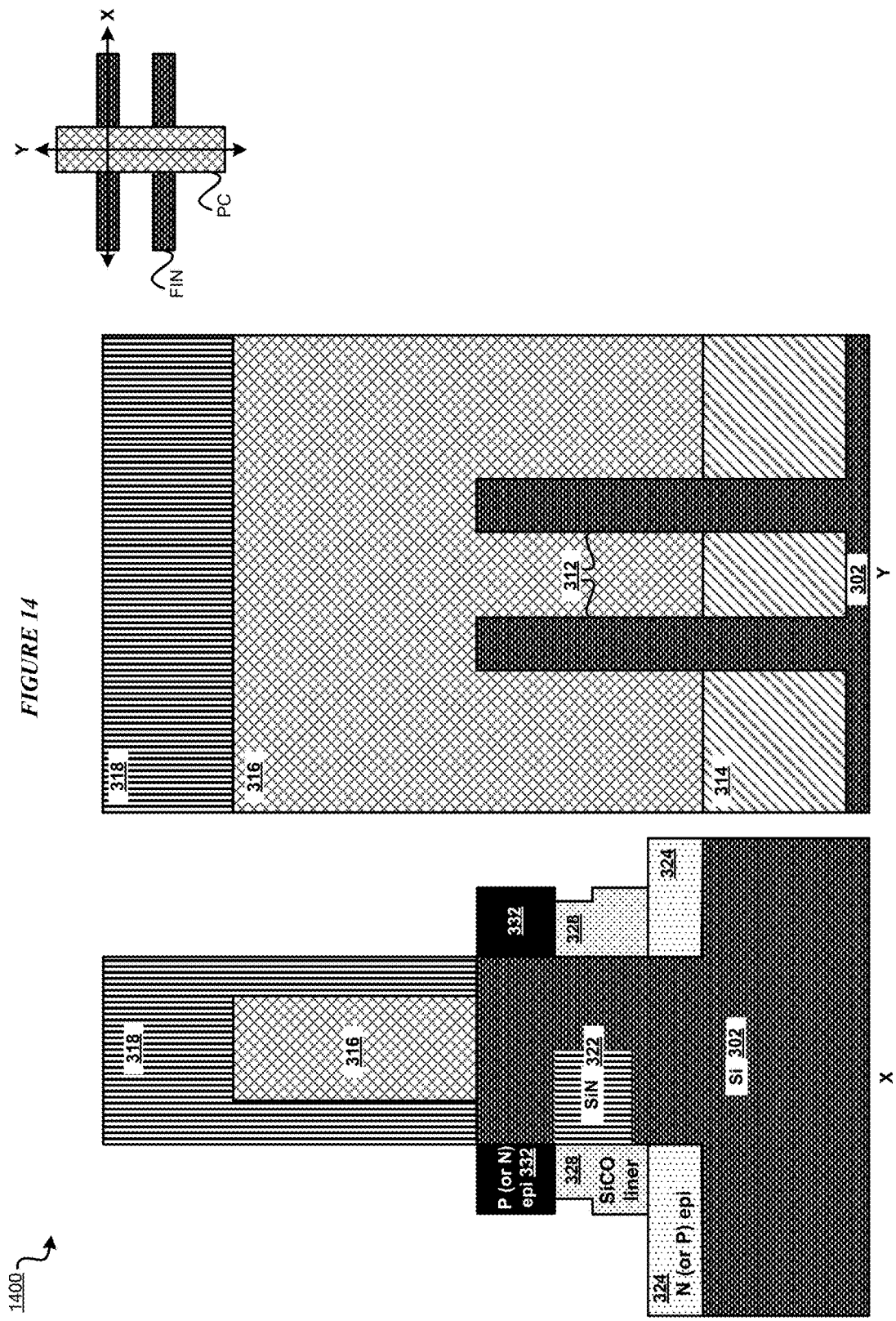
FIG. 14 depicts another portion of a process according to an illustrative embodiment.

With reference to FIG. 14, FIG. 14 depicts another portion of a process in which a structure 1400 is formed according to an embodiment. In the embodiment, fabrication system 107 optionally etches away a portion of liner 328 from n-type epitaxy layer 324 such that liner 328 is to self-aligned with p-type epitaxy layer 332.

Figure 15:
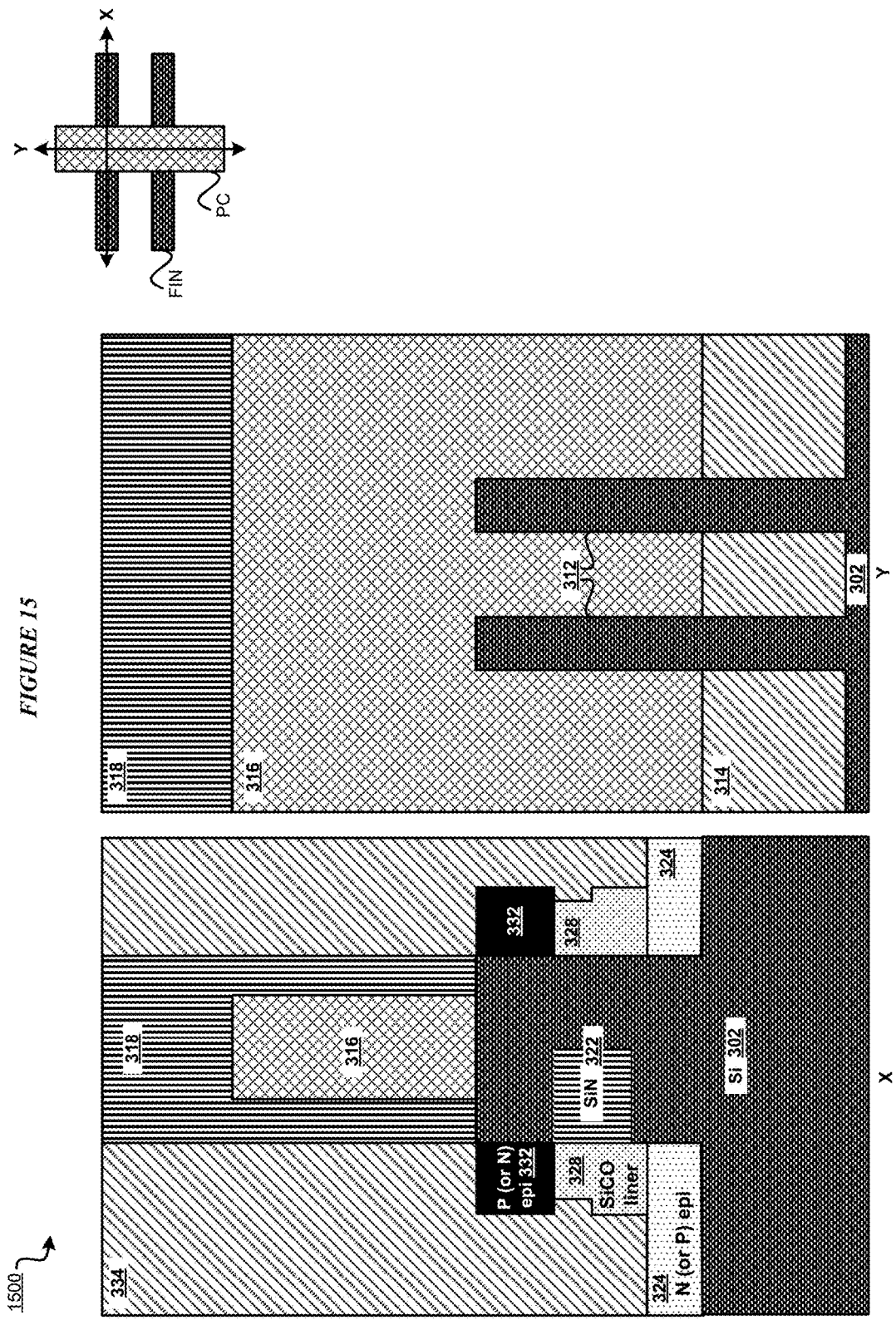
FIG. 15 depicts another portion of a process according to an illustrative embodiment.

With reference to FIG. 15, FIG. 15 depicts another portion of a process in which a structure 1500 is formed according to an embodiment. In one or more embodiments, fabrication system 107 deposits an interlayer dielectric (ILD) fill 334 upon portions of n-type epitaxy layer 324, liner 328, p-type epitaxy layer 332, and spacer 318. In the embodiment, fabrication system 107 further performs a chemical-mechanical planarization (CMP) process on a top surface of ILD fill 334 to planarize and/or polish the top surface of ILD fill 334.

Figure 16:
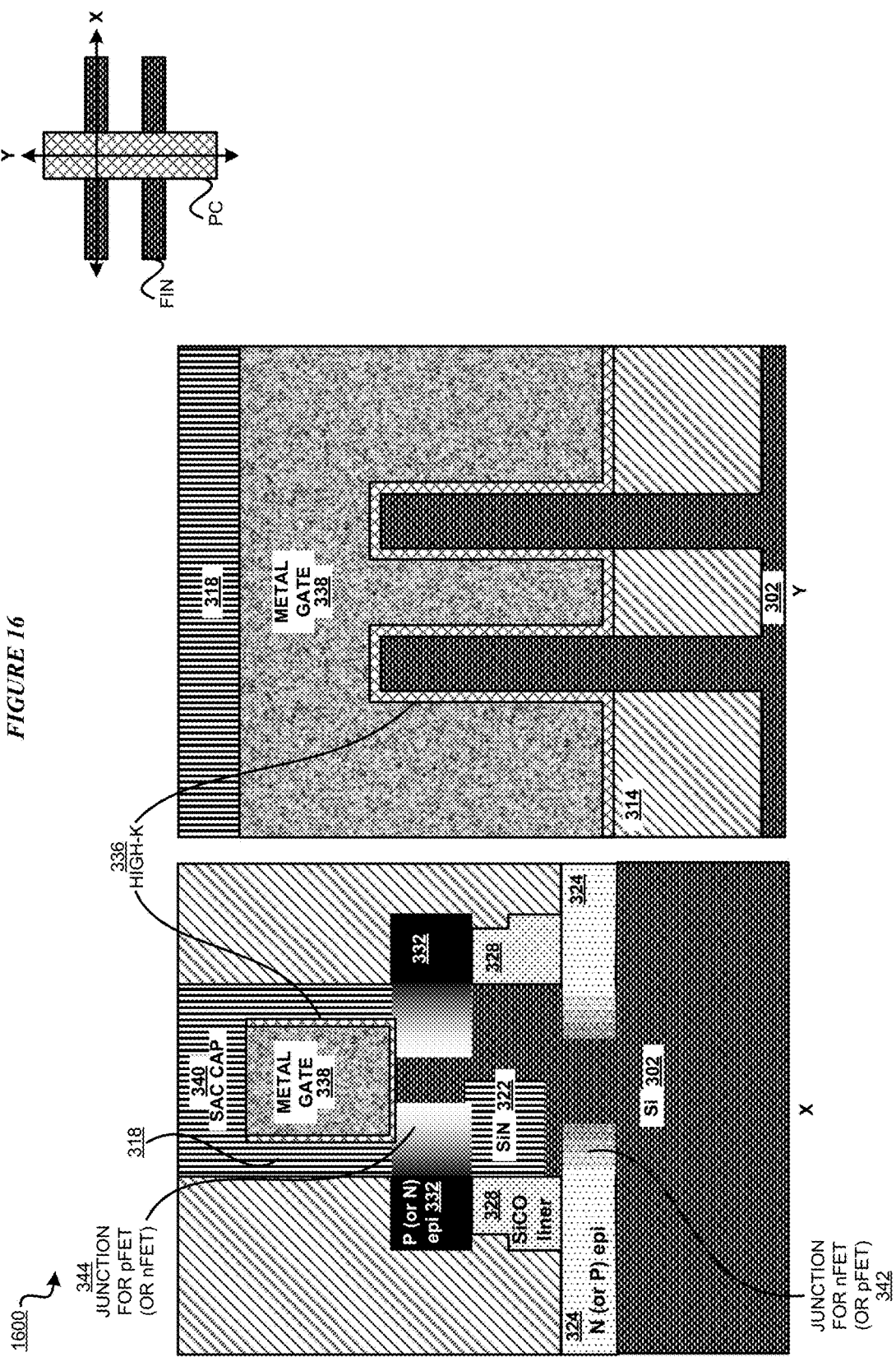
FIG. 16 depicts another portion of a process according to an illustrative embodiment.

With reference to FIG. 16, FIG. 16 depicts another portion of a process in which a structure 1600 is formed according to an embodiment. In one or more embodiments, fabrication system 107 removes dummy gate 316, deposits a high-k layer 336, and metal gate material 338 to form a high-k/metal gate. In a particular embodiment, metal gate material 338 is a high-k gate material (HKGM). In the embodiment, fabrication system 107 further deposits a self-aligned cap (SAC) on top of high-k/metal gate 338. In the embodiment, fabrication system 107 further forms an NFET junction 342 between n-type epitaxy layer 324 and the fin channel of fins 312, and a PFET junction 344 between p-type epitaxy layer 332 and the fin channel of fins 312. In one or more embodiments, NFET junction 342 and PFET junction 344 can be formed at any suitable process step, for example, after source/drain epitaxy. In particular embodiments, NFET junction 342 and PFET junction 344 are formed by a thermal annealing process to drive dopants towards the fin channel.

Figure 17:
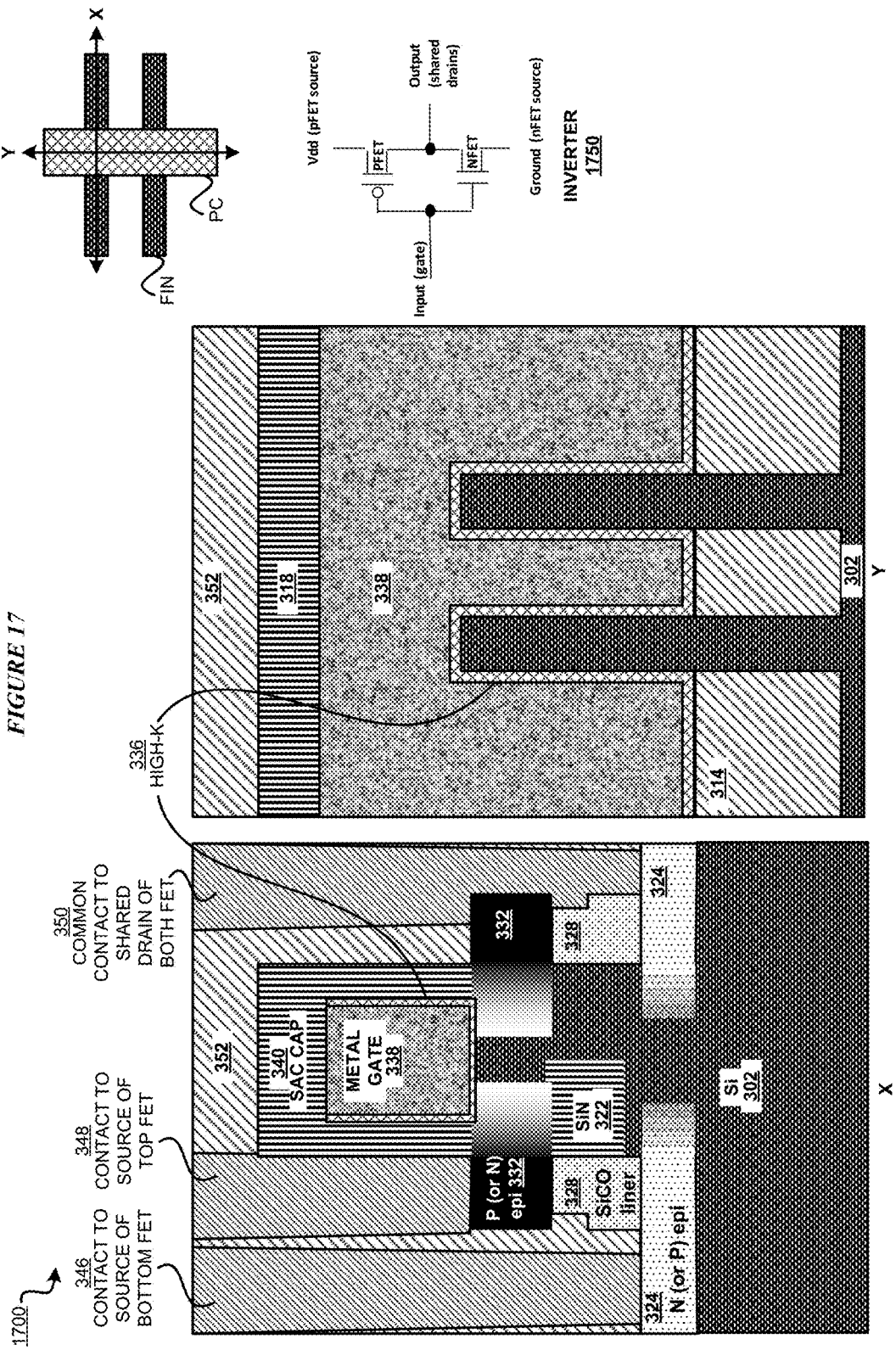
FIG. 17 depicts another portion of a process according to an illustrative embodiment.

With reference to FIG. 17, FIG. 17 depicts another portion of a process in which a structure 1700 is formed according to an embodiment. In one or more embodiments, fabrication system 107 forms a first contact 346 to the source of the bottom NFET formed of NFET epitaxy layer 324, a second contact 348 to the source of the top PFET formed of PFET epitaxy layer 332, and a third common contact to the shared drain of the NFET and PFET. In the embodiment, fabrication system 107 further deposits additional ILD fill layer 352. In a particular embodiment, structure 1700 forms a portion of an inverter 1750.

Figure 18:
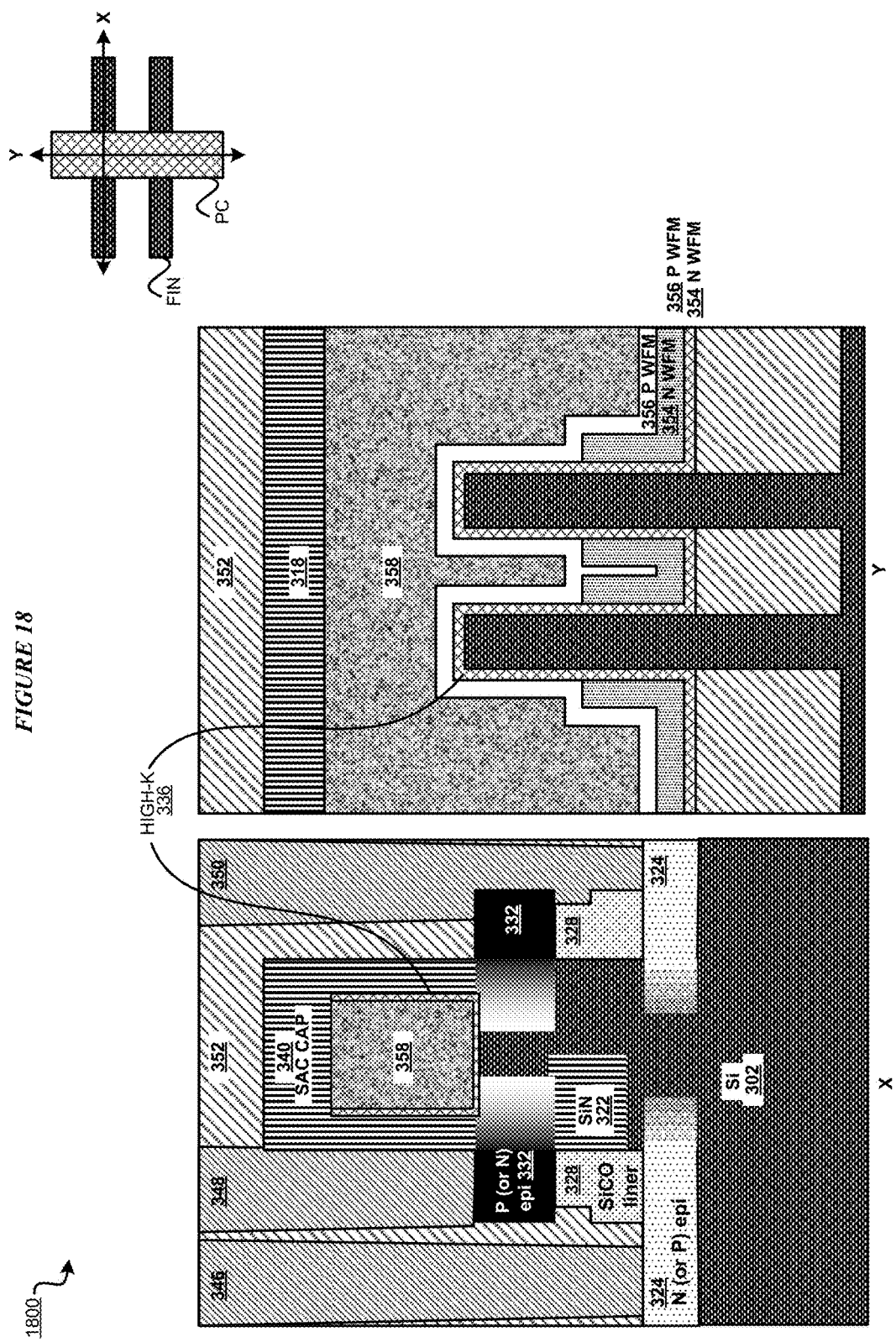
FIG. 18 depicts a portion of a process according to another illustrative embodiment.

With reference to FIG. 18, FIG. 18 depicts a portion of a process in which a structure 1800 is formed according to another embodiment. In the embodiment, fabrication system 107 deposits an n-type work function metal (WFM) on high-K liner 336, and a p-type WFM 356 on n-type WFM 354. In the embodiment, tungsten (W) material 358 is used to fill the rest of the gate gap. By using different work function metals for the NFET and PFET, different threshold voltages ($V_t$) can be set for the NFET and PFET.

Figure 19:
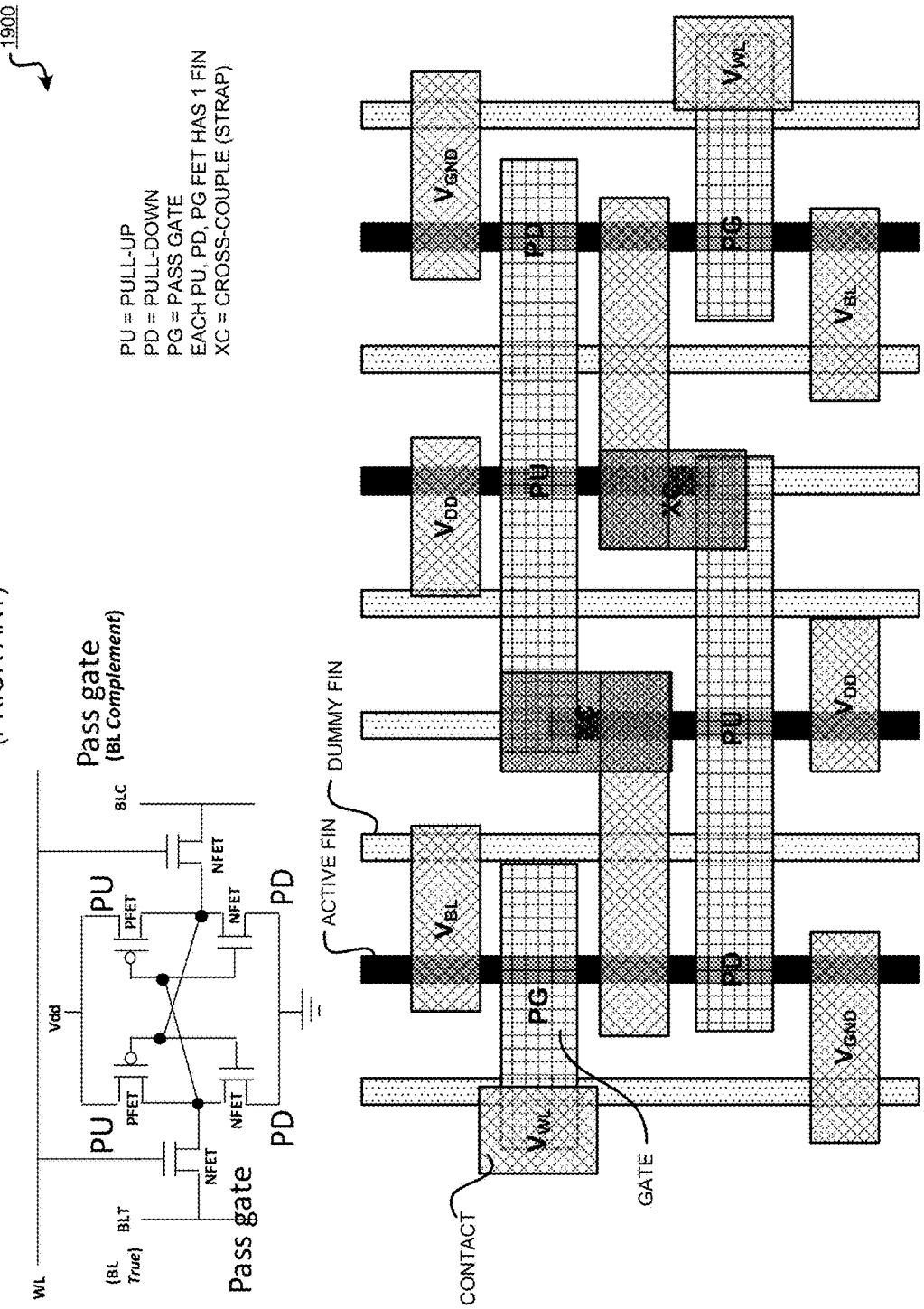
FIG. 19 depicts a conventional FinFET static random access memory (SRAM) cell.

With reference to FIG. 19, FIG. 19 depicts a conventional FinFET static random access memory (SRAM) cell 1900. FIG. 19 illustrates a conventional "1-1-1" FinFET SRAM cell 1900 composed of pull-up (PU) FETs, pull-down (PD) FETs, and pass gate (PG) FETs, four active fins, and cross-couples (XC). Each PU FET, PD FET, and PG FET has one fin.

Figure 20:
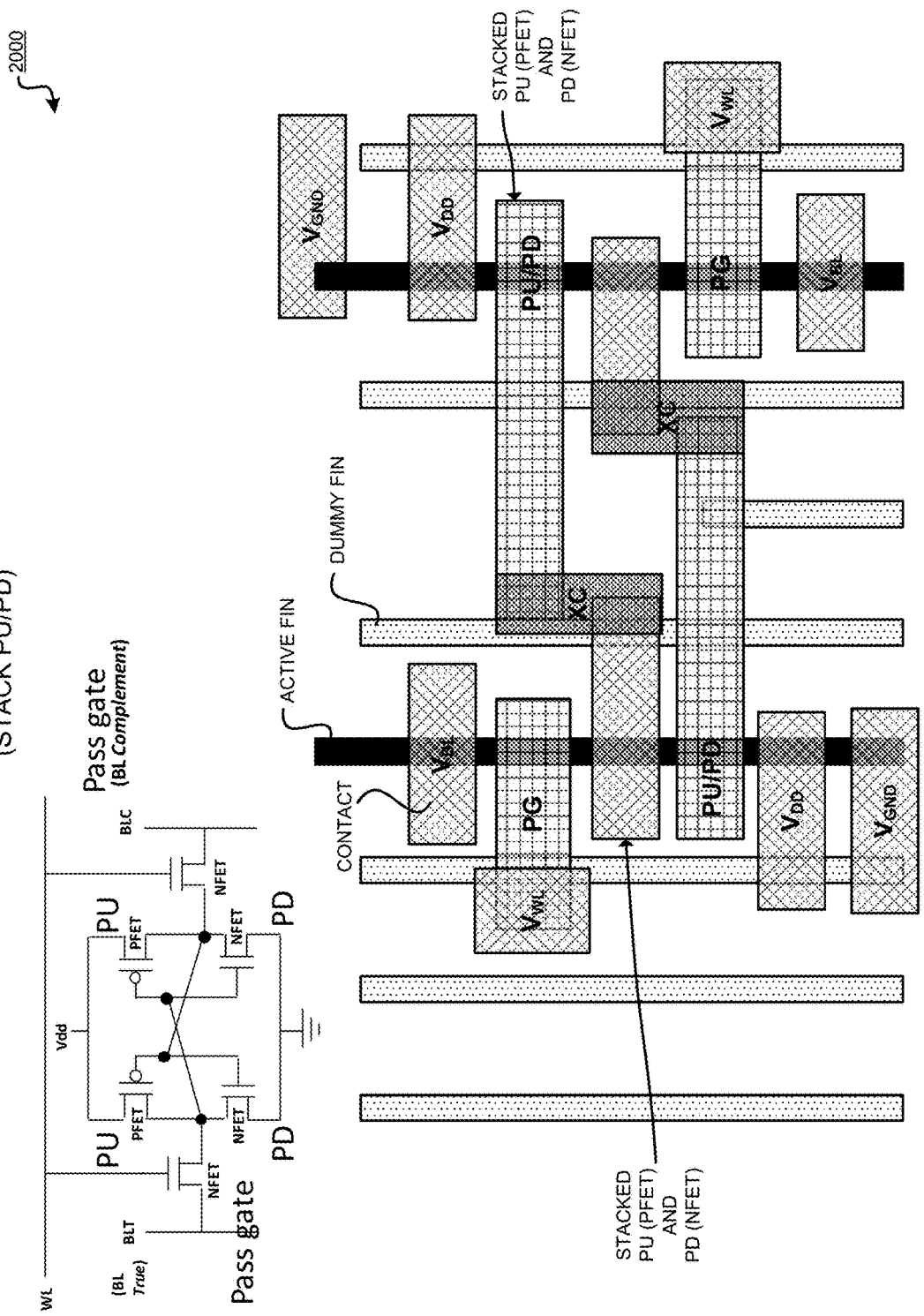
FIG. 20 depicts a FinFET SRAM cell fabricated using vertically stacked multi-channel transistor structures in accordance with an illustrative embodiment.

With reference to FIG. 20, FIG. 20 depicts a FinFET static random access memory (SRAM) cell 2000 fabricated using vertically stacked multi-channel transistor structures in accordance with an illustrative embodiment. FIG. 20 illustrates a "1-1-1" FinFET SRAM cell 2000 composed of two stacked PFET (PU) and NFET (PD) transistor structures fabricated as described herein and two active fins. In the particular embodiment illustrated in FIG. 20, the "1-1-1" FinFET SRAM cell 2000 uses approximately 20% less chip area than the conventional "1-1-1" FinFET SRAM cell 1900 depicted in FIG. 19.

Figure 21:
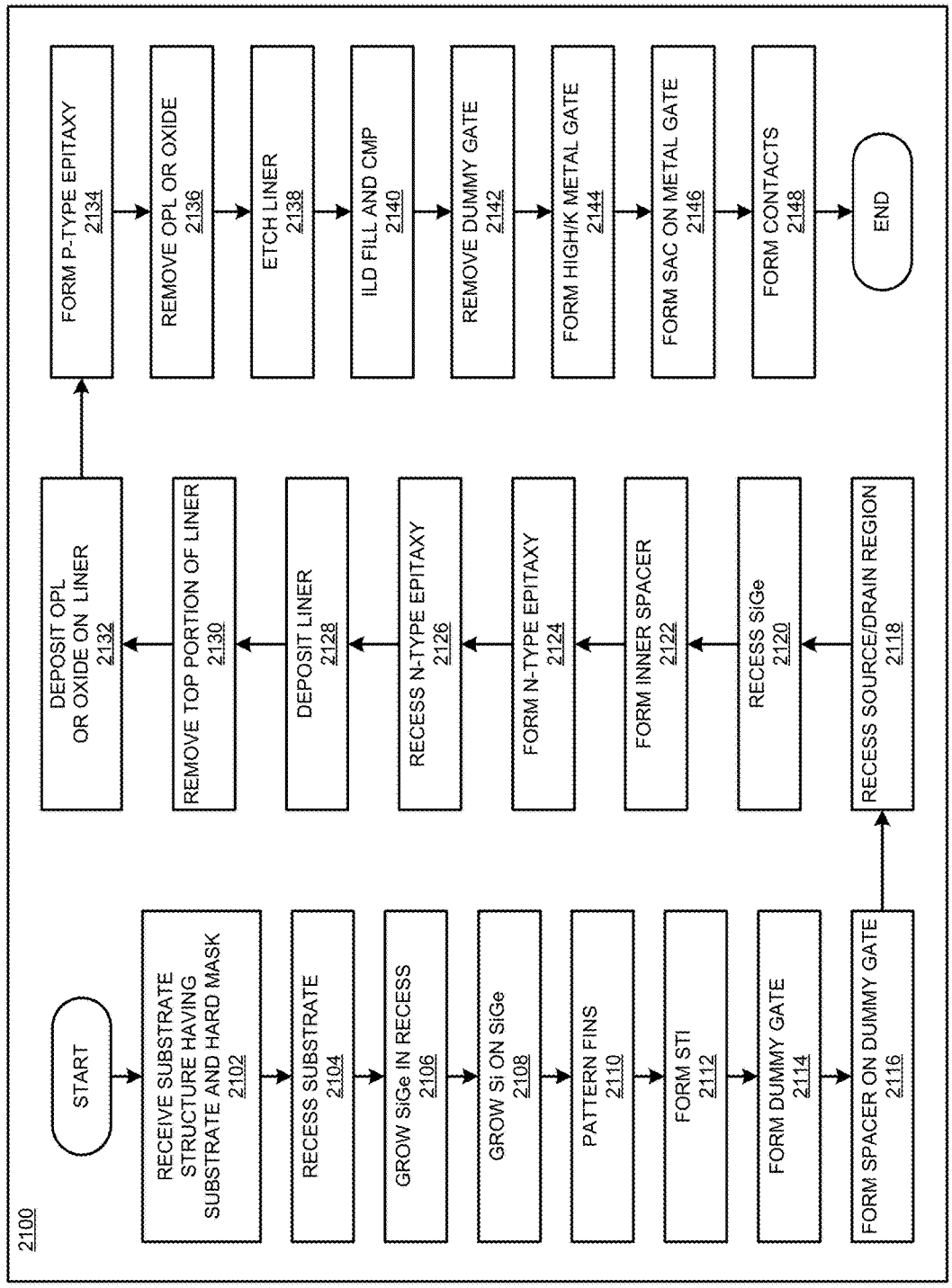
FIG. 21 depicts a flowchart of an example process for vertically stacked multi-channel transistor structures in accordance with an illustrative embodiment.

With reference to FIG. 21, FIG. 21 depicts a flowchart of an example process 2100 for fabricating vertically stacked multi-channel transistor structures in accordance with one or more illustrative embodiments. Process 2100 can be implemented in fabrication system 107 in FIG. 1, to perform one or more steps of FIGS. 3-17 as needed in process 2100.

In block 2102, fabrication system 107 receives substrate structure 300 including substrate 302 having hard mask 304 deposited or otherwise formed on the top surface of substrate 302. In particular embodiments, substrate 302 is formed of a silicon (Si) material and hard mask 304 is formed of a silicon nitride (SiN) material. In block 2104, fabrication system 107 forms recess 306 within a portion of substrate 302 and hard mask 304. In one or more embodiments, fabrication system 107 forms recess 306 within a portion of substrate 302 and hard mask 304 using an etching process.

In block 2106, fabrication system 107 forms sacrificial layer 308 in recess 306. In one or more embodiments, fabrication system 107 forms sacrificial layer 308 in recess 306 by growing sacrificial layer 308 upon an upper surface of recess 306 of substrate 302. In a particular embodiment, sacrificial layer 308 is formed of an SiGe material. In block 2108, fabrication system 107 further forms an additional substrate layer (e.g., Si layer 310) upon sacrificial layer 308 to a top surface of the non-recessed portion of substrate 302. In one or more embodiments, fabrication system 107 forms the substrate layer upon sacrificial layer 308 by growing Si layer 310 or another substrate material layer upon an upper surface of sacrificial layer 308.

In block 2110, fabrication system 107 removes hard mask 304 and patterns substrate 302 to form two vertical fins 312 of substrate 302. In a particular embodiment, fabrication system 107 forms fins 312 using a photolithography process. In block 2112, fabrication system 107 forms STI material 314 on portions of substrate 302 adjacent to fins 312.

In block 2114, fabrication system 107 forms vertical dummy gate 316 on portions of substrate 302 and Si layer 310. In block 2116, fabrication system 107 forms spacer 318 over portions of dummy gate 316. In a particular embodiment, spacer 318 is formed of an oxide material. In one or more embodiments, fabrication system forms dummy gate 316 and/or spacer 318 by a deposition process.

In block 2118, fabrications system 107 forms recesses 320 within source/drain (S/D) regions of substrate 302 adjacent to spacer 318 in which recesses 320 extend through portions of Si layer 310, sacrificial layer 308, and substrate 302. In block 2120, fabrication system 107 recesses sacrificial layer 308 to substantially remove sacrificial layer 308 to form a cavity. In a particular embodiment, fabrication system 107 recesses sacrificial layer 308 using an etching process. In block 2122, fabrication system 107 forms inner spacer 322 in the cavity caused by the removal of sacrificial layer 308 such that sacrificial layer 308 is substantially replaced with inner spacer 322 to form a 90-degree rotated U-shaped fin disposed on substrate 302. In a particular embodiment, inner spacer 322 is formed of a SiN material.

In block 2124, fabrication system 107 forms an n-type epitaxy layer 324 upon substrate 302. In a particular embodiment, fabrication system 107 forms n-type epitaxy layer 324 using an epitaxy growth process. In an alternative embodiment, fabrication system 107 forms a p-type epitaxy layer instead of n-type epitaxy layer 324. In block 2126, fabrication system 107 recesses n-type epitaxy layer 324 to form recesses 326 to expose inner spacer 322.

In block 2128, fabrication system 107 deposits a liner 328 on portions of n-type epitaxy layer 324, inner spacer 322, and spacer 318. In a particular embodiment, liner 328 is formed of a silicon oxycarbide (SiCO) material. In block 2130, fabrication system 107 removes a top portion of liner 328 from spacer 318 such that liner 328 remains upon n-type epitaxy layer 324 and inner spacer 322. In block 2132, fabrication system 107 deposits an organic planarizing layer (OPL) or oxide layer 330 upon portions of liner 328.

In block 2134, fabrication system 107 forms a p-type epitaxy layer 332 upon a top portion of liner 328. In a particular embodiment, fabrication system 107 forms p-type epitaxy layer 332 using an epitaxy growth process. In an alternative embodiment in which an n-type epitaxy layer is formed instead of a p-type epitaxy layer on substrate 302 as described in block 2124, fabrication system 107 forms a n-type epitaxy layer instead of p-type epitaxy layer 324 upon the top portion of liner 328. In block 2136, fabrication system 107 removes (OPL) or oxide layer 330. In block 2138, fabrication system 107 optionally etches away a portion of liner 328 from n-type epitaxy layer 324 such that liner 328 is to self-aligned with p-type epitaxy layer 332.

In block 2140, fabrication system 107 deposits interlayer dielectric (ILD) fill 334 upon portions of n-type epitaxy layer 324, liner 328, p-type epitaxy layer 332, and spacer 318. In the embodiment, fabrication system 107 further performs a chemical-mechanical planarization (CMP) process on a top surface of ILD fill 334 to planarize and/or polish the top surface of ILD fill 334.

In block 2142, fabrication system 107 removes dummy gate 316. In block 2144, fabrication system 107 deposits a high-k layer 336, and metal gate material 338 in a void caused by removal of dummy gate 316 to form a high-k/metal gate. In a particular embodiment, metal gate material 338 is a high-k gate material (HKGM). In block 2146, fabrication system 107 deposits a self-aligned cap (SAC) on top of high-k/metal gate 338. In the embodiment, fabrication system 107 further forms an NFET junction 342 between n-type epitaxy layer 324 and the fin channel, and a PFET junction 344 between p-type epitaxy layer 332 and the fin channel. In one or more embodiments, NFET junction 342 and PFET junction 344 can be formed at any suitable process step, for example, after source/drain epitaxy. In particular embodiments, NFET junction 342 and PFET junction 344 are formed by a thermal annealing process to drive dopants towards the fin channel.

In block 2148, fabrication system 107 forms a first contact 346 to the source of the bottom NFET formed of NFET epitaxy layer 324, a second contact 348 to the source of the top PFET formed of PFET epitaxy layer 332, and a third common contact to the shared drain of the NFET and PFET. In an embodiment, fabrication system 107 further deposits additional ILD fill layer 352. Fabrication system 107 ends process 2100 thereafter.

Thus, a computer implemented method, system or apparatus, and computer program product are provided in the illustrative embodiments for fabricating vertically stacked multi-channel transistor structures in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of fabricating a vertically stacked transistor, comprising:
  receiving a substrate structure having a substrate and a hard mask formed on a top surface of the substrate;
  forming a first recess within a portion of the substrate and the hard mask;
  forming a sacrificial layer within the first recess;
  forming a substrate layer upon a top surface of the sacrificial layer;
  forming at least one fin in the substrate;
  forming at least one second recess extending through portions of the substrate layer, the sacrificial layer, and the substrate;
  removing at least a portion of the sacrificial layer within the at least one second recess to form a cavity;
  forming an inner spacer in the cavity;
  forming a first epitaxy layer upon the substrate;
  forming a liner on portions of the first epitaxy layer and the inner spacer; and
  forming a second epitaxy layer upon a top portion of the liner, the first epitaxy layer and the second epitaxy layer sharing a common U-shaped fin body formed by the inner spacer and the at least one fin.

2. The method of claim 1, wherein the at least one second recess is formed within a source/drain (S/D) region of the substrate.

3. The method of claim 1, further comprising:
  recessing, prior to forming the liner, the first epitaxy layer to expose the inner spacer.

4. The method of claim 1, further comprising:
  removing, prior to forming the second epitaxy layer, a top portion of the liner such that the liner remains upon the first epitaxy layer and the inner spacer;
  depositing an organic planarizing layer (OPL) upon portions of the liner; and
  removing, after forming of the second epitaxy layer, the OPL from the liner.

5. The method of claim 1, further comprising:
  etching a portion of the liner from the first epitaxy layer such that the liner is aligned with the second epitaxy layer.

6. The method of claim 1, further comprising:
  forming, prior to forming the at least one second recess, a dummy gate on a portion of the substrate and substrate layer; and
  forming a spacer over portions of the dummy gate.

7. The method of claim 6, wherein the at least one second recess is formed adjacent to the spacer.

8. The method of claim 6, further comprising:
  removing the dummy gate; and
  forming a metal gate in a void caused by removal of the dummy gate.

9. The method of claim 1, further comprising:
  forming a first contact to a source region of the first epitaxy layer;
  forming a second contact to a source region of the second epitaxy layer; and
  forming a third contact to a drain region shared by the first epitaxy layer and the second epitaxy layer.

10. The method of claim 1, further comprising:
  forming a first junction between the first epitaxy layer and the at least one fin; and
  forming a second junction between the second epitaxy layer and the at least one fin.

11. The method of claim 1, wherein the first epitaxy layer includes an n-type epitaxy material, and the second epitaxy layer includes a p-type epitaxy material.

12. The method of claim 1, wherein the first epitaxy layer includes a p-type epitaxy material, and the second epitaxy layer includes an n-type epitaxy material.

13. The method of claim 1, wherein the sacrificial layer is formed of a silicon-germanium (SiGe) material.

14. The method of claim 1, wherein the inner spacer is formed of a silicon nitride (SiN) material.

* * * * *